(12) United States Patent
Kim et al.

(10) Patent No.: US 10,249,757 B2
(45) Date of Patent: Apr. 2, 2019

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Bong Cheol Kim, Seongnam-si (KR); Hyung Suk Lee, Suwon-si (KR); Eun Shoo Han, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/386,901

(22) Filed: Dec. 21, 2016

(65) Prior Publication Data

US 2018/0175199 A1 Jun. 21, 2018

(51) Int. Cl.
*H01L 29/78* (2006.01)
*H01L 21/762* (2006.01)
*H01L 29/165* (2006.01)
*H01L 29/10* (2006.01)

(52) U.S. Cl.
CPC .... *H01L 29/7849* (2013.01); *H01L 21/76224* (2013.01); *H01L 29/1054* (2013.01); *H01L 29/165* (2013.01); *H01L 29/785* (2013.01)

(58) Field of Classification Search
CPC .................................................. H01L 29/7849
USPC ....................................................... 257/190
See application file for complete search history.

(56) References Cited

U.S. PATENT DOCUMENTS

| | | | |
|---|---|---|---|
| 7,625,790 B2 | 12/2009 | Yang | |
| 9,012,270 B2 | 4/2015 | Xu et al. | |
| 9,368,604 B1 * | 6/2016 | Dal | H01L 29/66795 |
| 9,484,412 B1 * | 11/2016 | Ando | H01L 29/1054 |
| 9,666,486 B1 * | 5/2017 | Ebrish | H01L 21/823807 |
| 2014/0054610 A1 | 2/2014 | Kim et al. | |
| 2014/0217467 A1 * | 8/2014 | Pawlak | H01L 29/12 257/183 |
| 2014/0287587 A1 | 9/2014 | Lee et al. | |
| 2014/0361378 A1 * | 12/2014 | Lee | H01L 27/0928 257/369 |
| 2014/0370712 A1 | 12/2014 | Kim et al. | |
| 2014/0374797 A1 * | 12/2014 | Kwon | H01L 29/1054 257/190 |
| 2015/0069465 A1 | 3/2015 | Cheng et al. | |
| 2015/0091057 A1 | 4/2015 | Xie et al. | |
| 2015/0093702 A1 | 4/2015 | Nyhus et al. | |
| 2015/0104946 A1 | 4/2015 | Park et al. | |

(Continued)

*Primary Examiner* — Igwe U Anya
(74) *Attorney, Agent, or Firm* — F. Chau & Associates, LLC

(57) ABSTRACT

A substrate includes a pattern forming region and a peripheral region. A first strain relaxed buffer layer is disposed on the pattern forming region of the substrate. A second strain relaxed buffer layer is disposed on the peripheral region of the substrate. A first insulating film pattern is disposed on the substrate. At least a portion of the first insulating film pattern is disposed within the first strain relaxed buffer layer. An upper surface of the first insulating film pattern is covered with the first strain relaxed buffer layer. A second insulating film pattern is disposed on the substrate. At least a portion of the second insulating film pattern is disposed within the second strain relaxed buffer layer. An upper surface of the second insulating film pattern is covered with the second strain relaxed buffer layer. A gate electrode is disposed on the first strain relaxed buffer layer.

21 Claims, 22 Drawing Sheets

(56) References Cited

U.S. PATENT DOCUMENTS

| | | | |
|---|---|---|---|
| 2016/0056277 A1* | 2/2016 | Lee | H01L 29/785 257/401 |
| 2016/0190304 A1* | 6/2016 | Morin | H01L 29/785 257/347 |
| 2016/0218181 A1* | 7/2016 | Yang | H01L 29/1054 |

* cited by examiner

Homogeneous

SEMICONDUCTOR DEVICE AND METHOD OF FABRICATING THE SAME

TECHNICAL FIELD

The present inventive concept relates to a semiconductor device and a method for fabricating the same.

DISCUSSION OF RELATED ART

The decrease in feature size of metal oxide semiconductor (MOS) transistors has led into decrease in a gate length and a channel length formed therebelow. The decrease of the channel length has also led into decreased mobility of electrical charges. The decrease in the mobility of electrical charges may be an obstacle in enhancing the saturation current of the MOS transistor.

SUMMARY

According to an exemplary embodiment of the present inventive concept, a semiconductor device is provided as follows. A substrate includes a pattern forming region and a peripheral region. A first strain relaxed buffer layer is disposed on the pattern forming region of the substrate. A second strain relaxed buffer layer is disposed on the peripheral region of the substrate. A first insulating film pattern is disposed on the substrate. At least a portion of the first insulating film pattern is disposed within the first strain relaxed buffer layer. An upper surface of the first insulating film pattern is covered with the first strain relaxed buffer layer. A second insulating film pattern is disposed on the substrate. At least a portion of the second insulating film pattern is disposed within the second strain relaxed buffer layer. An upper surface of the second insulating film pattern is covered with the second strain relaxed buffer layer. A gate electrode is disposed on the first strain relaxed buffer layer.

According to an exemplary embodiment of the present inventive concept, a semiconductor device is provided as follows. A substrate includes a first pattern forming region and a peripheral region. A first compound semiconductor layer includes a first lower compound semiconductor layer and a first upper compound semiconductor layer on the first pattern forming region of the substrate. A second compound semiconductor layer includes a second lower compound semiconductor layer and a second upper compound semiconductor layer on the peripheral region of the substrate. A first insulating film pattern extends across a portion of the substrate and the first lower compound semiconductor layer. An upper surface of the first insulating film pattern is covered with the first upper compound semiconductor layer. A second insulating film pattern extends across a portion of the substrate and the second lower compound semiconductor layer. An upper surface of the second insulating film pattern is covered with the second upper compound semiconductor layer. A first fin-type pattern is disposed on the first compound semiconductor layer. A first gate electrode intersects the first fin-type pattern.

According to an exemplary embodiment of the present inventive concept, a semiconductor device is provided as follows. A substrate includes a pattern forming region and a peripheral region. A first SiGe (silicon germanium) layer is disposed on the pattern forming region of the substrate. A second SiGe layer is disposed on the peripheral region of the substrate. A germanium fraction of the second SiGe layer is substantially same as a germanium fraction of the first SiGe layer. A first insulating film pattern extends across a portion of the substrate and a portion of the first SiGe layer. A second insulating film pattern extends across a portion of the substrate and a portion of the second SiGe layer. A fin-type pattern is disposed on the first SiGe layer. The fin-type pattern includes a material having a lattice constant different from a lattice constant of the first SiGe layer. A gate electrode intersects the fin-type pattern.

According to an exemplary embodiment of the present inventive concept, a method of fabricating a semiconductor device is provided as follows. A lower compound semiconductor layer is formed on a pattern forming region of a substrate and a peripheral region of the substrate. A block copolymer film is formed on the lower compound semiconductor layer. A plurality of first patterns and a plurality of second patterns filling a space between two adjacent first patterns of the plurality of first patterns are formed by a phase separation process of the block copolymer film. A mask pattern is formed on the lower compound semiconductor layer by removing the plurality of second patterns. A first trench is formed in the pattern forming region and a second trench is formed in the peripheral region by removing the lower compound semiconductor layer with the mask pattern. A first insulating film pattern filling the first trench and a second insulating film pattern filling the second trench are formed. An upper compound semiconductor layer is formed on the first insulating film pattern and the second insulating film pattern.

According to an exemplary embodiment of the present inventive concept, a method of fabricating a semiconductor device is provided as follows. A lower compound semiconductor layer is formed on a wafer. A block copolymer film is formed on the lower compound semiconductor layer. An annealing process is performed on the block copolymer film to form a plurality of first patterns and a plurality of second patterns filling a space between two adjacent first patterns of the plurality of first patterns from the block copolymer film. The plurality of first patterns is removed. A plurality of trenches penetrating the lower compound semiconductor layer is formed using the plurality of second patterns as an etching mask. A plurality of insulating film patterns is formed in the plurality of trenches. An upper compound semiconductor layer is formed on the plurality of insulating film patterns.

BRIEF DESCRIPTION OF THE DRAWINGS

These and other features of the inventive concept will become more apparent by describing in detail exemplary embodiments thereof with reference to the accompanying drawings of which.

Figure 1:
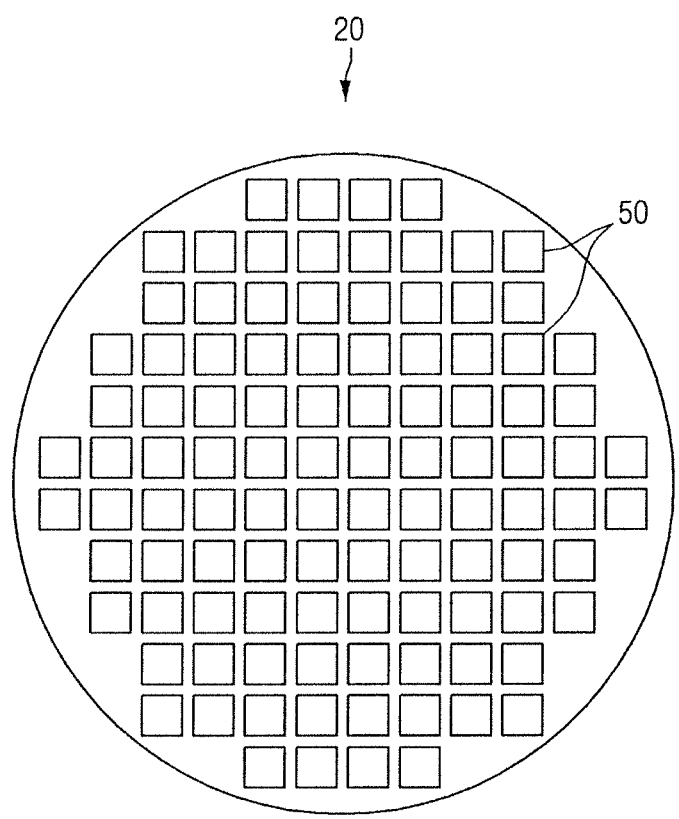
FIG. 1 shows a top view of a wafer including a semiconductor device in which a plurality of semiconductor die regions is arrayed according to some example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Although drawings regarding a semiconductor device according to some example embodiments exemplify a fin-type transistor (FinFET) including a channel region in a fin-type pattern shape, example embodiments are not limited thereto. It is of course possible that the semiconductor device according to some example embodiments may include a tunneling transistor (tunneling FET), a transistor including nanowire, a transistor including nano-sheet, or a three-dimensional (3D) transistor.

Hereinbelow, a semiconductor device according to some example embodiments will be explained with reference to FIGS. 1 to 5C.

Figure 2:
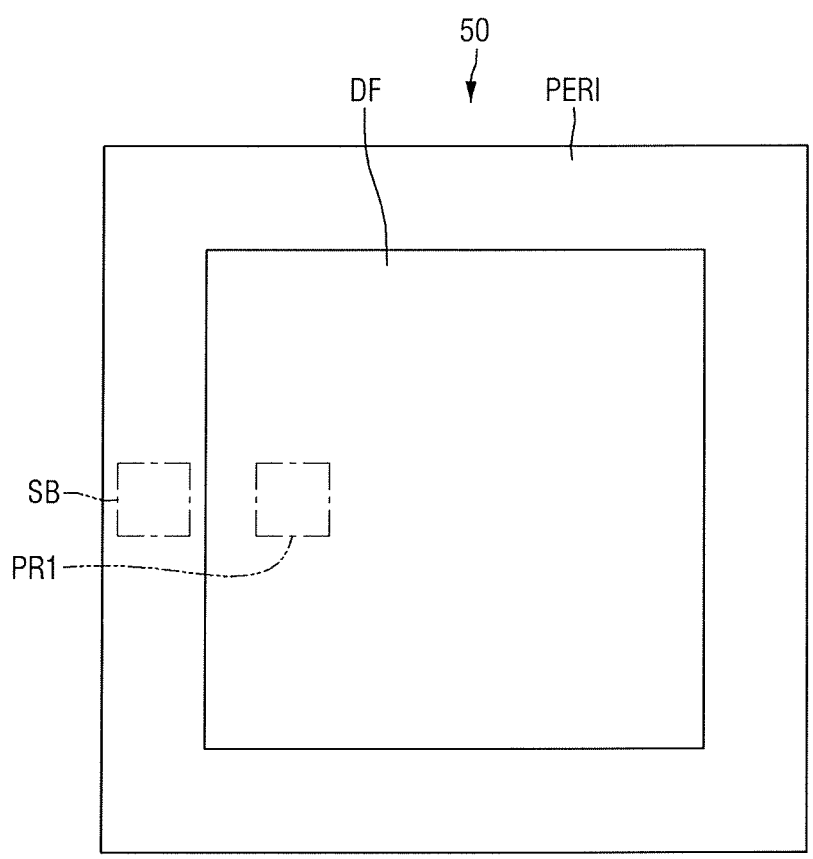
FIG. 2 shows one of the semiconductor die regions in FIG. 1.
Figure 3A:
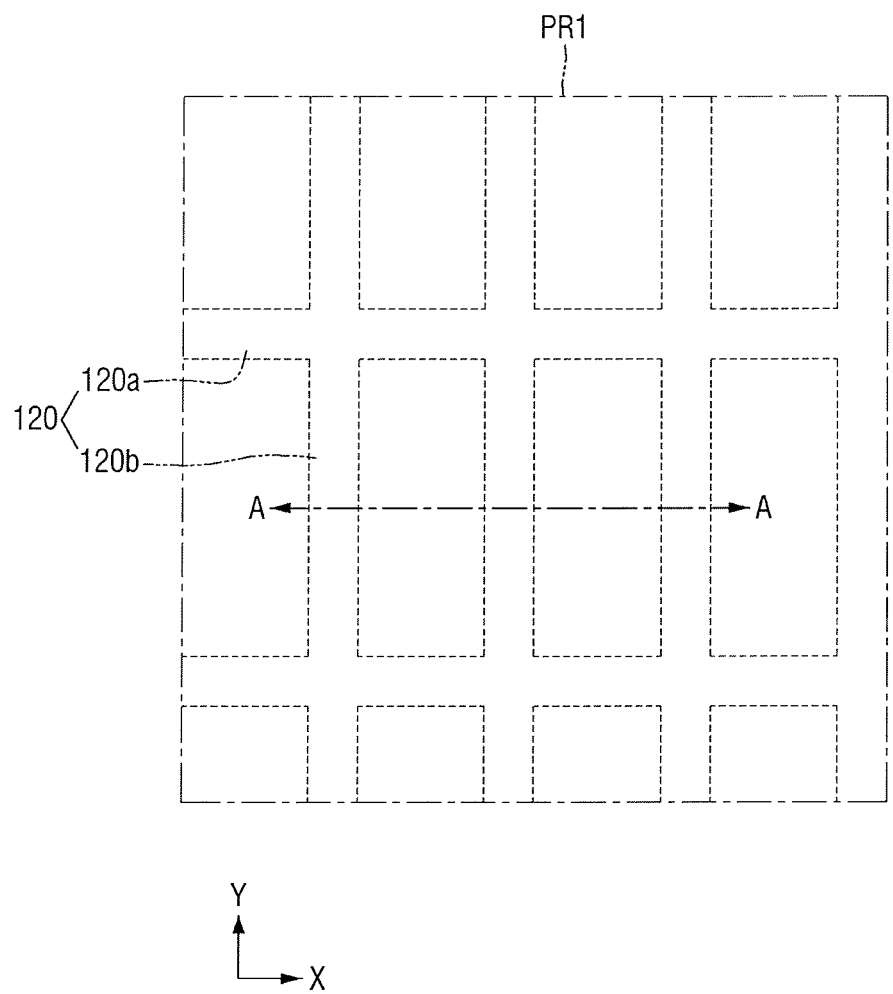
FIG. 3A shows a top view of a portion of the device forming region in FIG. 2.
Figure 3B:
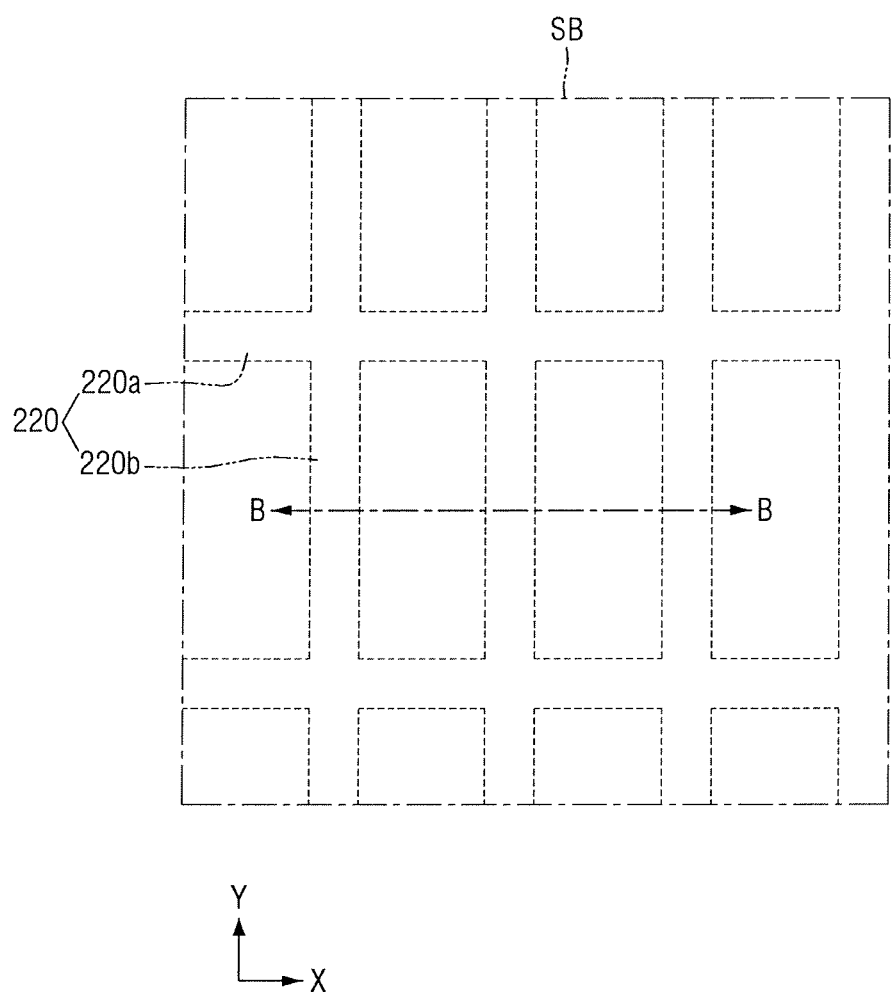
FIG. 3B shows a top view of a portion of the peripheral region in FIG. 2.
Figure 4:
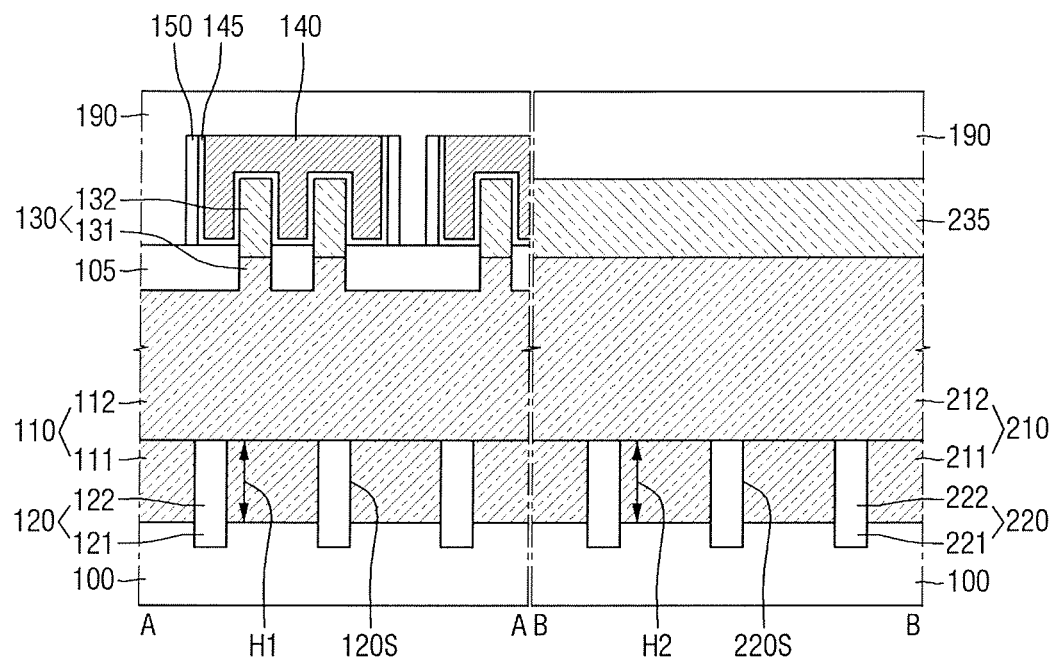
FIG. 4 is a cross sectional view taken along lines A-A and B-B of FIGS. 3A and 3B.
Figure 5A:
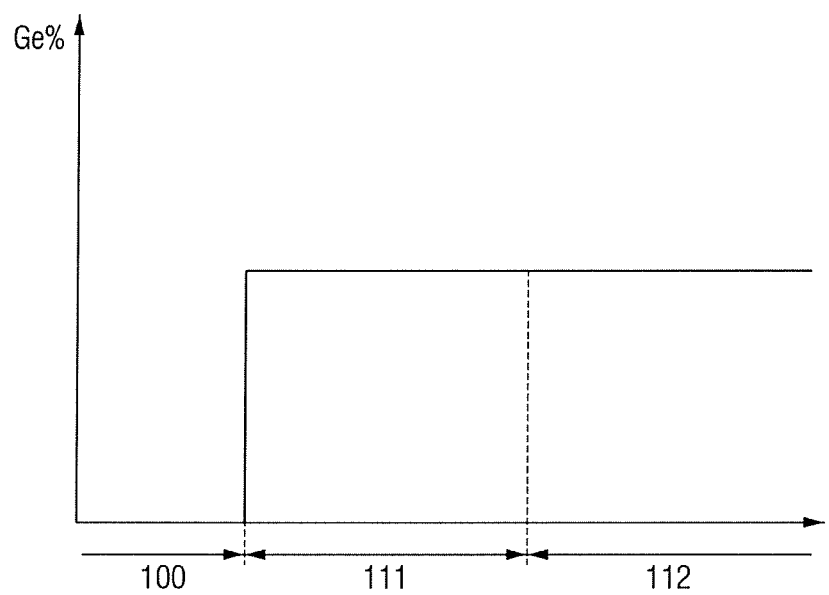
FIGS. 5A to 5C show graphs of a germanium fraction of a strain relaxed buffer layer.
Figure 5B:
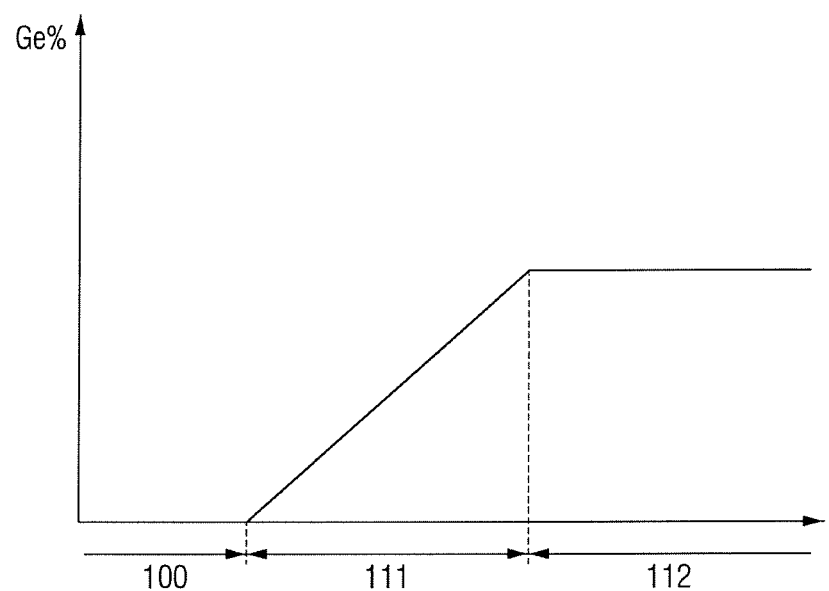
Figure 5C:
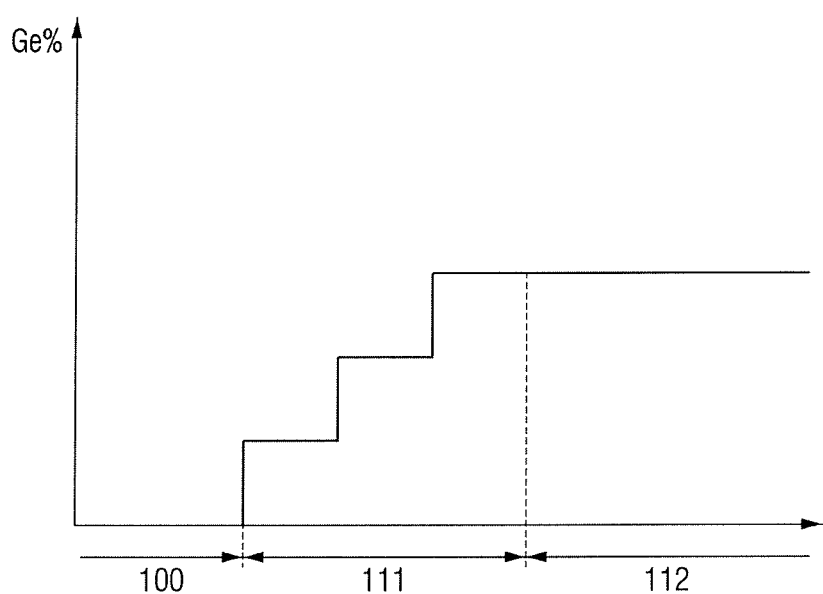

FIG. 1 is an example top view of a wafer including a semiconductor device in which a plurality of semiconductor die regions is arrayed according to some example embodiments; FIG. 2 is a view of one of the semiconductor die regions in FIG. 1. FIG. 3A is an example top view of a portion of the device forming region DF in FIG. 2. FIG. 3B is an example top view of a portion of the peripheral region PERI in FIG. 2. FIG. 4 is a cross sectional view taken along lines A-A and B-B of FIGS. 3A and 3B. FIGS. 5A to 5C shows a germanium fraction of a strain relaxed buffer layer.

For reference, FIGS. 3A and 3B exclude illustration of a fin-type pattern and a gate electrode to describe shapes of a first insulating film pattern 120 and a second insulating film pattern 220.

Referring to FIGS. 1 to 5C, the semiconductor device according to some example embodiments may include a substrate 100, a first strain relaxed buffer layer 110, a second strain relaxed buffer layer 210, a first insulating film pattern 120, a second insulating film pattern 220, and a first gate electrode 140.

The substrate 100 may include a device forming region DF, and a peripheral region PERI. The peripheral region PERI may be defined on a peripheral area of the device forming region DF. For example, the peripheral region PERI may surround the device forming region DF.

Referring to FIGS. 1 and 2, the device forming region DF and the peripheral region PERI will be more specifically explained below. FIG. 1 illustrates the wafer including a plurality of the semiconductor die regions 50 which is not separated into each of the semiconductor die regions 50. FIG. 2 illustrates the semiconductor die region 50 separated from the wafer 20 by sectioning the wafer 20 with the utilization of a scribing process.

The wafer 20 may include a plurality of the arrayed semiconductor die regions 50. With a scribing line used in the scribing process, each of the semiconductor die regions 50 may be separated from one another within the wafer 20.

The semiconductor die regions 50 may include the device forming region DF. The device forming region DF may be defined by using a reticle of a lithography process. For example, a region which is transferred onto the photoresist film by emitting a light source through the reticle with a device pattern drawn thereon may be the device forming region DF. The device pattern drawn on the reticle may include gate electrodes and so on. The device forming region DF may be a shot region of the lithography process. The device forming region DF may be a pattern forming region where a device pattern is formed. For example, the device forming region DF may include a first pattern forming region PR1.

The semiconductor die region 50 may include the peripheral region PERI defined on a perimeter of the device forming region DF. For example, the peripheral region PERI may surround the device forming region DF. The peripheral region PERI may be positioned on a perimeter of a region that is transferred on the photoresist film with a utilization of the reticle. The peripheral region PERI may include, for example, a shot boundary region SB of the lithography process. The peripheral region PERI may be a region where the device pattern drawn on the reticle is not transferred. The peripheral region PERI may be a region where gate electrodes, for example, are not formed. When the device forming region DF is repeatedly transferred on the wafer 20 with a utilization of the reticle, the shot boundary region SB may serve as a region that separates adjacent device forming regions DF from one another.

The peripheral region PERI may include a portion of a scribing line used in the scribing process and so on, but the present inventive concept is not limited thereto. For example, the scribing line left after being used in the scribing process and so on may be positioned along the peripheral region PERI. Because the scribing line does not include a shot region of the lithography process in which gate electrodes are formed, the gate electrodes need not be formed on the wafer 20 or the substrate 100 corresponding to the scribing line.

Because the semiconductor die region 50 includes the substrate 100 in FIGS. 2 to 4, the substrate 100 may include the device forming region DF and the peripheral region PERI. For example, the substrate 100 may include the first pattern forming region PR1 and the shot boundary region SB.

The substrate 100 may include a bulk silicon, a silicon-on-insulator (SOI), or a silicon substrate, or may include a material such as silicon germanium, silicon germanium on insulator (SGOI), silicon carbide, indium antimonide, lead telluride compounds, indium arsenide, indium phosphide, gallium arsenide, or gallium antimonide, but the present inventive concept is not limited thereto.

In a semiconductor device according to some example embodiments, it is described that the substrate 100 is a silicon substrate including silicon.

The first strain relaxed buffer layer 110 may be formed on the substrate 100. The first strain relaxed buffer layer 110 may be formed in the first pattern forming region PR1 of the device forming region DF. The first strain relaxed buffer layer 110 may include a first lower strain relaxed buffer layer 111 and a first upper strain relaxed buffer layer 112.

The second strain relaxed buffer layer 210 may be formed on the substrate 100. The second strain relaxed buffer layer 210 may be formed in the shot boundary region SB of the peripheral region PERI. The second strain relaxed buffer layer 210 may include a second lower strain relaxed buffer layer 211, and a second upper strain relaxed buffer layer 212.

The first lower strain relaxed buffer layer 111 and the second lower strain relaxed buffer layer 211 may be formed at a same level, and the first upper strain relaxed buffer layer 112 and the second upper strain relaxed buffer layer 212 may be formed at another same level. The term "same level" as used herein refers to being formed by a same fabricating process.

A method of dividing the first lower strain relaxed buffer layer 111 and the first upper strain relaxed buffer layer 112 will be described below.

The first strain relaxed buffer layer 110 and the second strain relaxed buffer layer 210 may include a compound semiconductor. The first strain relaxed buffer layer 110 and the second strain relaxed buffer layer 210 may include, for example, IV-IV group compound semiconductor or III-V group compound semiconductor. For example, the first strain relaxed buffer layer 110 and the second strain relaxed buffer layer 210, formed of IV-IV group compound semiconductor, may be a binary compound or a ternary compound including at least two or more of carbon (C), silicon (Si), germanium (Ge) and tin (Sn), such as silicon germanium, or these compounds doped with IV group elements. For example, the first strain relaxed buffer layer 110 and the second strain relaxed buffer layer 210, formed of III-V group compound semiconductor, may be one of a binary compound, a ternary compound or a quaternary compound which is formed by a combination of a III group element, which may be at least one of aluminum (Al), gallium (Ga), and indium (In), and a V group element, which may be one of phosphorus (P) and arsenic (As).

The first strain relaxed buffer layer 110 and the second strain relaxed buffer layer 210 may be formed on the substrate 100 using an epitaxial growth method. For example, the first strain relaxed buffer layer 110 and the second strain relaxed buffer layer 210 may be formed by using an atmospheric pressure chemical vapor deposition (APCVD), a low (or reduced) pressure chemical vapor deposition (LPCVD), an ultra high vacuum chemical vapor deposition (UHD-CVD), a molecular beam epitaxy (MBE), a metal organic chemical vapor deposition (MOCVD) and so on, but the present inventive concept is not limited hereto.

The first strain relaxed buffer layer 110 and the second strain relaxed buffer layer 210 may have a crystalline structure similar to that of the substrate 100. For example, a silicon substrate used as the substrate 100 may have a diamond crystalline structure. In this case, the first strain relaxed buffer layer 110 and the second strain relaxed buffer layer 210 including a compound semiconductor may have a zinc-blende structure similar to the diamond crystalline structure of the substrate 100.

In an exemplary embodiment, the first strain relaxed buffer layer 110 and the second strain relaxed buffer layer 210 are SiGe (silicon germanium) layers. For example, the first strain relaxed buffer layer 110 and the second strain relaxed buffer layer 210 may be SiGe (silicon germanium) layers with elastic stress relaxation in the first pattern forming region PR1 and the shot boundary region SB, respectively.

The first strain relaxed buffer layer 110 and the second strain relaxed buffer layer 210 may include, for example, $Si_{1-x}Ge_x$. Herein, x may be greater than 0 and less than 1. A germanium fraction of the first strain relaxed buffer layer 110 and a germanium fraction of the second strain relaxed buffer layer 210 may be greater than a germanium fraction of the substrate 100.

For example, as in FIG. 5A, the first strain relaxed buffer layer 110 may have a uniform germanium fraction in a thickness direction of the first strain relaxed buffer layer 110, i.e., in a thickness direction of the substrate 100. For example, the thickness direction may be substantially perpendicular to an upper surface of the substrate 100 on which the first strain relaxed buffer layer 110 may be formed. In FIG. 5A, the x-axis represents an arrangement of the substrate 100, the first lower strain relaxed buffer layer 111 and the first upper strain relaxed buffer layer 112. The numbers on the x-axis correspond to the reference numerals 100, 111 and 112. A germanium fraction of the first lower strain relaxed buffer layer 111 may be same as a germanium fraction of the first upper strain relaxed buffer layer 112. In view of a lattice constant, a lattice constant of the first strain relaxed buffer layer 110 may be consistent in the thickness direction of the substrate 100.

The second strain relaxed buffer layer 210 is formed at a same level as the first strain relaxed buffer layer 110. For example, the first relaxed buffer layer 110 and the second strain relaxed buffer layer 210 may be formed using a same fabrication process. In this case, a germanium fraction of the second strain relaxed buffer layer 210 may be same as the germanium fraction of the first strain relaxed buffer layer 110.

In an exemplary embodiment, as illustrated in FIG. 5B, the first strain relaxed buffer layer 110 may include a portion in which a germanium fraction continuously increases as being farther away from the substrate 100. For example, the first strain relaxed buffer layer 110 may include a portion in which a lattice constant continuously increases as being farther away from the substrate 100.

For example, a germanium fraction of the first lower strain relaxed buffer layer 111 may continuously increase as being farther away from the substrate 100. For example, a lattice constant of the first lower strain relaxed buffer layer 111 may continuously increase as being farther away from the substrate 100. A germanium fraction of the first upper strain relaxed buffer layer 112 or a lattice constant of the first upper strain relaxed buffer layer 112 may be consistent in the thickness direction of the substrate 100.

Herein, the term, "lattice constant of material A" refers to a lattice constant of a fully relaxed state of the A material. For example, when material B is positioned above material A and material C is positioned under material A, a lattice constant of material A positioned between material B and material C may be changed by being influenced from material B and/or material C. However, in the present disclosure, it is described that a lattice constant of material A refers to a lattice constant free from the influence from material B and/or material C.

For example, when $Si_{0.75}Ge_{0.25}$ film is formed on Si substrate, and $Si_{0.75}Ge_{0.25}$ film is in fully strained state, a lattice constant of $Si_{0.75}Ge_{0.25}$ film formed on the Si substrate may be substantially same as a lattice constant of silicon. In contrast, when $Si_{0.75}Ge_{0.25}$ film is in fully relaxed state, a lattice constant of $Si_{0.75}Ge_{0.25}$ film may be greater than a lattice constant of the Si substrate. That is, a lattice constant of $Si_{0.75}Ge_{0.25}$ film may be changed according to a strained state of $Si_{0.75}Ge_{0.25}$ film. In the present disclosure, a lattice constant of $Si_{0.75}Ge_{0.25}$ film is described to be greater than a lattice constant of the Si substrate.

In an exemplary embodiment, as illustrated in FIG. 5C, the first strain relaxed buffer layer 110 may include a portion in which a germanium fraction increases in a step-wise manner as being farther away from the substrate 100. For example, the first strain relaxed buffer layer 110 may include a portion in which a lattice constant increases in a step-wise manner as being farther away from the substrate 100.

For example, a germanium fraction of the first lower strain relaxed buffer layer 111 may increase in a step-wise manner as being farther away from the substrate 100. For example, a lattice constant of the first lower strain relaxed buffer layer 111 may increase in a step-wise manner as being farther away from the substrate 100. A germanium fraction of the first upper strain relaxed buffer layer 112 or a lattice constant of the first upper strain relaxed buffer layer 112 may be consistent in the thickness direction of the substrate 100.

In FIGS. 5A to 5C, a germanium fraction of the first upper strain relaxed buffer layer 112 is illustrated to be consistent in the thickness direction of the substrate 100. The present inventive concept is not limited thereto. The first upper strain relaxed buffer layer 112 may also include a portion in which a germanium fraction continuously increases or increases in a step-wise manner.

Since the substrate 100 includes silicon and the first strain relaxed buffer layer 110 and the second strain relaxed buffer layer 210 include silicon and germanium, lattice constants of the first strain relaxed buffer layer 110 and the second strain relaxed buffer layer 210 may be greater than a lattice constant of the substrate 100.

FIGS. 5A to 5C illustrate that a germanium fraction of the substrate 100 is 0. The present inventive concept is not limited thereto. For example, the substrate 100 may include, for example, germanium diffused from a Ge-containing thin film on the substrate 100. In an exemplary, in a process of fabricating the substrate 100, impurity for the thermodynamic stability may be included in the substrate 100. In this case, germanium may be included as the impurity of the substrate 100.

The first insulating film pattern 120 may be formed on the substrate 100. At least a portion of the first insulating film pattern 120 may be disposed within the first strain relaxed buffer layer 110.

In an exemplary embodiment, the first insulating film pattern 120 may be formed to extend across a portion of the substrate 100 and a portion of the first strain relaxed buffer layer 110. For example, the first insulating film pattern 120 may extend across from a portion of the substrate 100 to a portion of the first strain relaxed buffer layer 110 in the thickness direction of the substrate 100. A lower surface of the first insulating film pattern 120 may be in contact with the portion of the substrate 100, and an upper surface of the first insulating film pattern 120 may be in contact with the portion of the first strain relaxed buffer layer 110.

An upper surface of the first insulating film pattern 120 may be covered with the first strain relaxed buffer layer 110. That is, a height H1 from the substrate 100 to the upper surface of the first insulating film pattern 120 may be less than a thickness of the first strain relaxed buffer layer 110.

The first insulating film pattern 120 may include an upper portion 122 and a lower portion 121. The lower portion 121 of the first insulating film pattern may be formed within the substrate 100, and the upper portion 122 of the first insulating film pattern may be formed within the first strain relaxed buffer layer 110. For example, The lower portion 121 of the first insulating film pattern 120 may be buried in the substrate 100, and the upper portion 122 of the first insulating film pattern may be buried in the first strain relaxed buffer layer 110. For example, the first insulating film pattern 120 may have a sidewall 120S which is in contact with the substrate 100 and the first strain relaxed buffer layer 110. The sidewall 120S of the first insulating film pattern 120 may extend in the thickness direction of the substrate 100.

The upper portion 122 of the first insulating film pattern 120 may be referred to as a first upper portion 122 and the lower portion 121 of the first insulating film pattern 120 may be referred to as a first lower portion 121. The upper portion 222 of the second insulating film pattern 220 may be referred to as a second upper portion 222 of the second insulating film pattern 220 and the lower portion 221 of the second insulating film pattern 220 may be referred to a second lower portion 221 of the second insulating film pattern 220.

For example, the first insulating film pattern 120 may extend across from the portion of the substrate 100 to the portion of the first lower strain relaxed buffer layer 111. The first upper strain relaxed buffer layer 112 may cover the upper surface of the first insulating film pattern 120. The upper portion 122 of the first insulating film pattern may be formed within the first lower strain relaxed buffer layer 111. The sidewall 120S of the upper portion 122 of the first insulating film pattern may be surrounded with the first lower strain relaxed buffer layer 111.

The second insulating film pattern 220 may be formed on the substrate 100. At least a portion of the second insulating film pattern 220 may be positioned within the second strain relaxed buffer layer 210.

For example, the second insulating film pattern 220 may be formed to extend across from a portion of the substrate 100 to a portion of the second strain relaxed buffer layer 210. An upper surface of the second insulating film pattern 220 may be covered with the second strain relaxed buffer layer 210. A height H2 from the substrate 100 to the upper surface of the second insulating film pattern 220 may be less than a thickness of the second strain relaxed buffer layer 210. A sidewall 220S of the second insulating film pattern 220 may extend from the portion of the substrate 100 to the portion of the second strain relaxed buffer layer 210 in the thickness direction of the substrate 100.

The second insulating film pattern 220 may include an upper portion 222 and a lower portion 221. The lower portion 221 of the second insulating film pattern 220 may be formed within the substrate 100, and the upper portion 222 of the second insulating film pattern 220 may be formed within the second strain relaxed buffer layer 210.

For example, the second insulating film pattern 220 may extend across a portion of the substrate 100 and a portion of the second lower strain relaxed buffer layer 211. The second upper strain relaxed buffer layer 212 may cover the upper surface of the second insulating film pattern 220. The upper portion 222 of the second insulating film pattern may be formed within the second lower strain relaxed buffer layer 211. The sidewall of the upper portion 222 of the second insulating film pattern may be surrounded with the second lower strain relaxed buffer layer 211.

The boundary of the first upper strain relaxed buffer layer 112 and the first lower strain relaxed buffer layer 111 may be the upper surface of the first insulating film pattern 120, and the boundary of the second upper strain relaxed buffer layer 212 and the second lower strain relaxed buffer layer 211 may be the upper surface of the second insulating film pattern 220. For example, the boundary of the first upper strain relaxed buffer layer 112 and the first lower strain relaxed buffer layer 111 may be coplanar with the upper surface of the first insulating film pattern 120. The boundary of the second upper strain relaxed buffer layer 212 and the second lower strain relaxed buffer layer 211 may be coplanar with the upper surface of the second insulating film pattern 220. In an exemplary embodiment, the upper surface of the first insulating film pattern 120 and the upper surface of the second insulating film pattern 220 may be positioned at substantially the same height from the upper surface of the substrate 100.

In some example embodiments, a height of the first insulating film pattern 120 may be greater than a thickness H1 of the first lower strain relaxed buffer layer 111, and a height of the second insulating film pattern 220 may be greater than a thickness H2 of the second lower strain relaxed buffer layer 211.

In view of a fabricating process, the first lower strain relaxed buffer layer 111 and the second lower strain relaxed buffer layer 211 may be simultaneously formed, and then, the first insulating film pattern 120 and the second insulating film pattern 220 may be formed. Therefore, a height H1 from the substrate 100 to the upper surface of the first insulating film pattern 120 may be substantially same as a height H2 from the substrate 100 to the upper surface of the second insulating film pattern 220.

In some example embodiments, a shape of the first insulating film pattern 120 and a shape of the second insulating film pattern 220 may be same as each other when viewed from a top view. For example, the first insulating film pattern 120 and the second insulating film pattern 220 may be formed in a mesh shape.

In FIG. 3A, the first insulating film pattern 120 may include a first portion 120a extending in a first direction X and a second portion 120b extending in a second direction Y. In an exemplary embodiment, the thickness direction of the substrate 100 discussed above may be substantially perpendicular to the first direction X and the second direction Y. The first portion 120a of the first insulating film pattern 120 and the second portion 120b of the first insulating film pattern 120 which extend in different directions from each other may be intersecting each other.

In FIG. 3B, the second insulating film pattern 220 may include a first portion 220a extending in the first direction X, and a second portion 220b extending in the second direction Y. The first portion 220a of the second insulating film pattern and the second portion 220b of the second insulating film pattern which extend in different directions from each other may be intersecting each other. In an exemplary embodiment, the thickness direction of the substrate 100 discussed above may be substantially perpendicular to the first direction X and the second direction Y. In an exemplary embodiment, the first direction X of FIG. 3B is in substantially parallel to the first direction X of FIG. 3A; and the second direction Y of FIG. 3B is in substantially parallel to the second direction X of FIG. 3A.

The first lower strain relaxed buffer layer 111 and the second lower strain relaxed buffer layer 211 may be surrounded with a rectangle defined by the first insulating film pattern 120 and the second insulating film pattern 220. For example, the first lower strain relaxed buffer layer 111 may be surrounded with a rectangle defined by the first portion 120a and the second portion 120b of the first insulating film pattern 120; and the second lower strain relaxed buffer layer 211 may be surrounded with a rectangle defined by the first portion 220a and the second portion 220b of the second insulating film pattern 220.

The first insulating film pattern 120 and the second insulating film pattern 220 may include, for example, silicon oxide, silicon nitride, silicon oxynitride, a low-k dielectric material, and a combination thereof.

The first insulating film pattern 120 and the second insulating film pattern 220 may be formed by using a pattern formed with a directed self assembly (DSA) process which will be described below.

When a pattern drawn on the reticle is repeatedly transferred on the wafer 20, no pattern shape may be formed on a space between the adjacent shot regions using the reticle (e.g., peripheral region PERI). Therefore, when a photo process using the reticle is used, the second insulating film pattern 220 need not be formed in the peripheral region PERI.

However, because the DSA process uses a block copolymer film formed entirely on the wafer 20, the pattern formed with the DSA process may be formed entirely on the wafer 20. Therefore, when the pattern formed with the DSA process is used, the second insulating film pattern 220 of the peripheral region PERI, as well as the first insulating film pattern 120 of the device forming region DF, may be formed.

A first fin-type pattern 130 may be formed on the first strain relaxed buffer layer 110. The first fin-type pattern 130 may protrude from the first strain relaxed buffer layer 110.

The first fin-type pattern 130 may include a lower portion 131 and an upper portion 132. The lower portion 131 of the first fin-type pattern may be formed by etching a portion of the first strain relaxed buffer layer 110. For example, the lower portion 131 of the first fin-type pattern may be formed by etching a portion of the first upper strain relaxed buffer layer 112. The upper portion 132 of the first fin-type pattern may include a material having a different lattice constant from that of the first strain relaxed buffer layer 110. In an exemplary embodiment, the upper portion 132 of the first fin-type pattern may include a material having a different lattice constant from a lattice constant of the first upper strain relaxed buffer layer 112.

For example, when the first pattern forming region PR1 is a P-type metal oxide semiconductor (PMOS) forming region, the upper portion 132 of the first fin-type pattern may include a material having a lattice constant greater than a lattice parameter of the first upper strain relaxed buffer layer 112. For example, the upper portion 132 of the first fin-type pattern may include $Si_{1-y}Ge_y$. Herein, y may be greater than 0 and less than or equal to 1.

A germanium fraction of the upper portion 132 of the first fin-type pattern may be greater than a germanium fraction of the first upper strain relaxed buffer layer 112. That is, the upper portion 132 of the first fin-type pattern may include a silicon germanium pattern having a germanium fraction greater than a germanium fraction of the first upper strain relaxed buffer layer 112, or the upper portion 132 of the first fin-type pattern may include a germanium pattern.

In an exemplary embodiment, when the first pattern forming region PR1 is an N-type metal oxide semiconductor (NMOS) forming region, the upper portion 132 of the first fin-type pattern may include a material having a lattice constant less than a lattice parameter of the first upper strain relaxed buffer layer 112. For example, the upper portion 132 of the first fin-type pattern may include a silicon pattern. Alternatively, the upper portion 132 of the first fin-type pattern may include a III-V compound semiconductor material having a high electron mobility.

In FIG. 4, the first fin-type pattern 130 is illustrated to include the lower portion 131 of the first fin-type pattern, but the present inventive concept is not limited hereto. The first fin-type pattern 130 may be composed of the upper portion 132 of the first fin-type pattern, i.e., without having the lower portion 131 of the first fin-type pattern.

A field insulating layer 105 may partially surround a sidewall of the first fin-type pattern 130. At least a portion of the first fin-type pattern 130 may protrude further than an upper surface of the field insulating layer 105. The field insulating layer 105 may include, for example, oxide, nitride, oxynitride, or a combination thereof, but the present inventive concept is not limited thereto.

The first gate electrode 140 may be formed on the first fin-type pattern 130. The first gate electrode 140 may be formed to intersect the first fin-type pattern 130. For example, the first gate electrode 140 may include, for example, polysilicon doped with impurity, metal, metal nitride, or a combination thereof.

In FIG. 4, the first gate electrode 140 may be formed through a replacement process (or gate last process) for example, but the present inventive concept is not limited thereto.

A first gate insulating film 145 may be formed between the first gate electrode 140 and the first fin-type pattern 130. The first gate insulating film 145 may include, for example, silicon oxide, metal oxide, or a combination thereof.

A first gate spacer 150 may be formed on a sidewall of the first gate electrode 140. The first gate spacer 150 may include, for example, silicon oxide, silicon nitride, or silicon oxynitride, but present inventive concept is not limited thereto.

A dummy channel layer 235 may be formed on the second strain relaxed buffer layer 210. The dummy channel layer 235 may include a material having a different lattice constant from a lattice constant of the second upper strain relaxed buffer layer 212. When the dummy channel layer 235 is formed like the upper portion 132 of the first fin-type pattern included in the PMOS forming region, the dummy channel layer 235 may include a material having a lattice constant greater than a lattice constant of the second upper strain relaxed buffer layer 212. In an exemplary embodiment, when the dummy channel layer 235 is formed like the upper portion 132 of the first fin-type pattern included in the NMOS forming region, the dummy channel layer 235 may include a material having a lattice constant less than a lattice constant of the second upper strain relaxed buffer layer 212 or include a III-V compound semiconductor having a high electron mobility.

In an exemplary embodiment, the dummy channel layer 235 need not be formed on the second strain relaxed buffer layer 210. When a material layer included in the upper portion 132 of the first fin-type pattern is formed after an insulating film pattern exposing the device forming region DF is formed, the dummy channel layer 235 need not be formed on the second strain relaxed buffer layer 210.

In an exemplary embodiment, the gate electrode need not be formed on the peripheral region PERI of the substrate 100.

An interlayer insulating film 190 may be formed on the first gate electrode 140 and the dummy channel layer 235. The interlayer insulating film 190 may include silicon oxide, silicon nitride, silicon oxynitride, a low-k dielectric material, or a combination thereof.

Figure 6A:
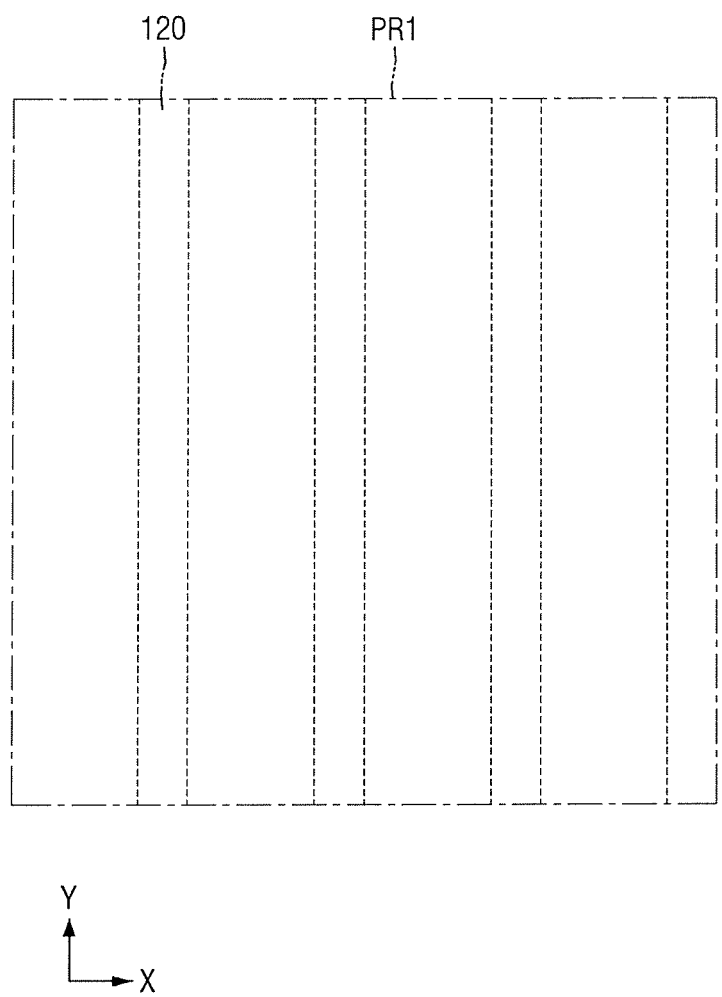
FIGS. 6A and 6B show a semiconductor device according to some example embodiments.
Figure 6B:
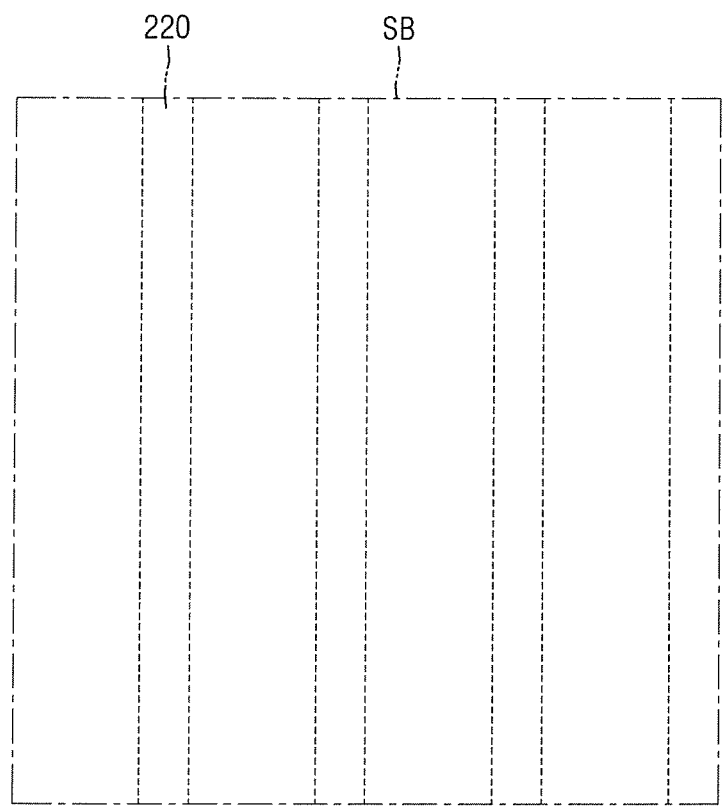
Figure 7A:
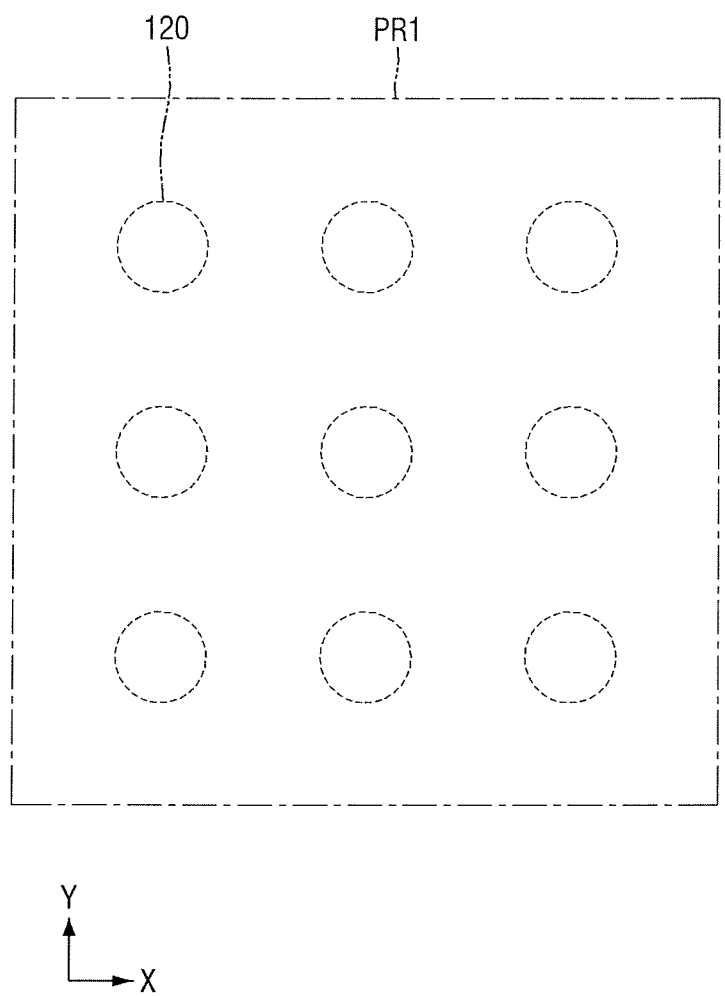
FIGS. 7A and 7B show a semiconductor device according to some example embodiments.
Figure 7B:
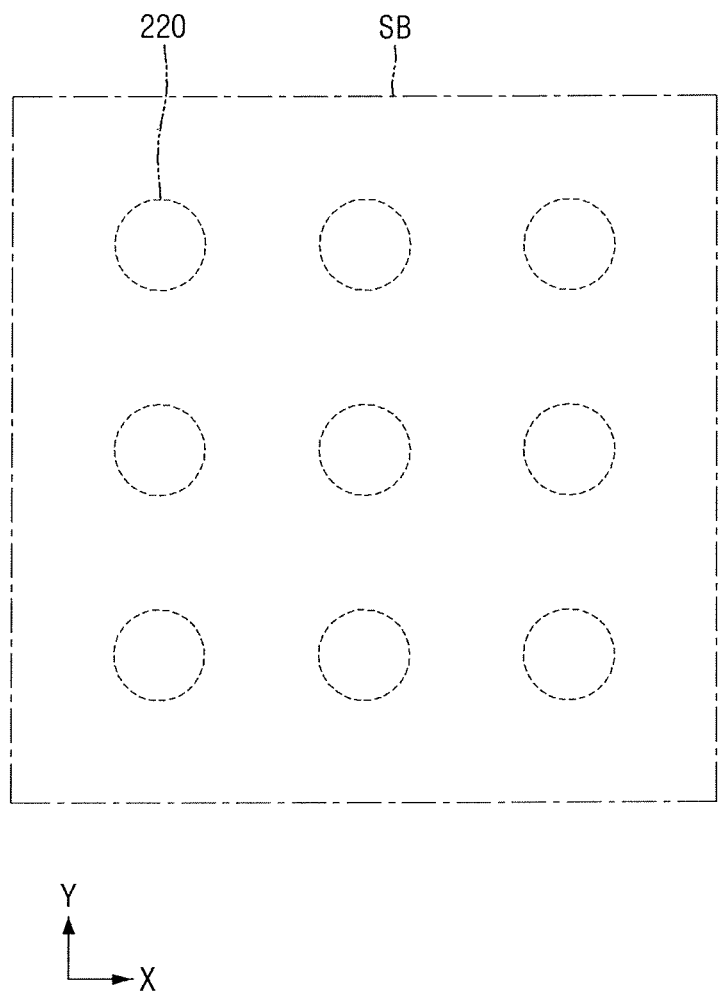

FIGS. 6A and 6B are views provided to describe a semiconductor device according to some example embodiments. FIGS. 7A and 7B are views provided to describe a semiconductor device according to some example embodiments. For convenience of description, differences that are not explained above with reference to FIGS. 1 to 5C will be described below.

For reference, a cross sectional view in the first direction X of FIGS. 6A and 6B and a cross sectional view in the first direction X of FIGS. 7A and 7B may be respectively similar to FIG. 4.

Referring to FIGS. 6A and 6B, the first insulating film pattern 120 formed in the first pattern forming region PR1 and the second insulating film pattern 220 formed in the shot boundary region SB may be in a line shape that extends longitudinally in the second direction Y, respectively. The first insulating film pattern 120 may be arranged in plural. The second insulating film pattern 220 may be arranged in plural. For the convenience of description, the first insulating film pattern 120 may be in a plural form of the first insulating film patterns 120 if two or more first insulating film patterns 120 are referred to; and the second insulating film pattern 220 may be in a plural form of the second insulating film patterns 220 if two or more second insulating film patterns 220 are referred to.

The first insulating film pattern 120 and the second insulating film pattern 220 which extend in parallel to each other need not be connected with each other. For example, the first insulating film pattern 120 and the second insulating film pattern 220 need not include a portion extending in the first direction X.

Referring to FIGS. 7A and 7B, the first insulating film pattern 120 formed in the first pattern forming region PR1 and the second insulating film pattern 220 formed in the shot boundary region SB may have a circular shape. The first insulating film patterns 120 may be arrayed along the first direction X and the second direction Y. The second insulating film patterns 220 may be arrayed along the first direction X and the second direction Y.

Figure 8:
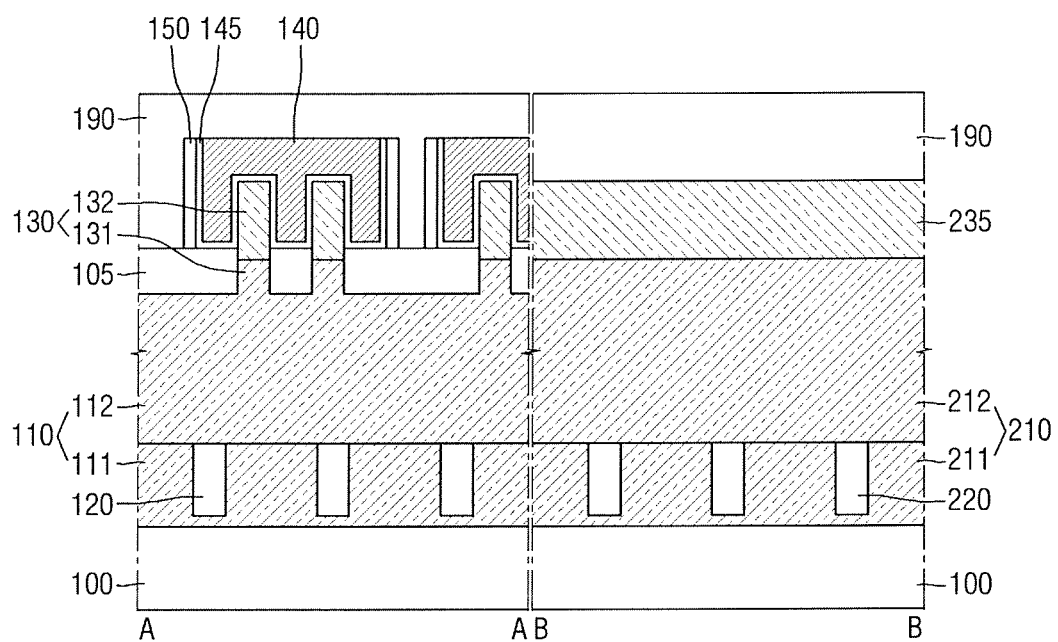
FIG. 8 shows a semiconductor device according to some example embodiments.

FIG. 8 shows a semiconductor device according to some example embodiments. For convenience of description, differences that are not explained above with reference to FIGS. 1 to 5C will be mainly described below.

Referring to FIG. 8, in the semiconductor device according to some example embodiments, the first insulating film pattern 120 may be disposed within the first strain relaxed buffer layer 110, and the second insulating film pattern 220 may be disposed within the second strain relaxed buffer layer 210.

The first insulating film pattern 120 and the second insulating film pattern 220 may be formed within the first lower strain relaxed buffer layer 111 and the second lower strain relaxed buffer layer 211. A height of the first insulating film pattern 120 and a height of the second insulating film pattern 220 may be less than a thickness of the first lower strain relaxed buffer layer 111 and a thickness of the second lower strain relaxed buffer layer 211.

A portion of the first lower strain relaxed buffer layer 111 may be interposed between the first insulating film pattern 120 and the substrate 100, and a portion of the second lower strain relaxed buffer layer 211 may be interposed between the second insulating film pattern 220 and the substrate 100. For example, the portion of the first lower strain relaxed buffer layer 111 may be interposed between a lower surface of the first insulating film pattern 120 and the substrate 100, and the portion of the second lower strain relaxed buffer layer 211 may be interposed between a lower surface of the second insulating film pattern 220 and the substrate 100.

In an exemplary embodiment, a height of the first insulating film pattern 120 may be substantially same as a thickness of the first lower strain relaxed buffer layer 111, and a height of the second insulating film pattern 220 may be substantially same as a thickness of the second lower strain relaxed buffer layer 211. In this case, the lower surface of the first insulating film pattern 120 may be in contact with the substrate 100, and the lower surface of the second insulating film pattern 220 may be in contact with the substrate 100.

Figure 9A:
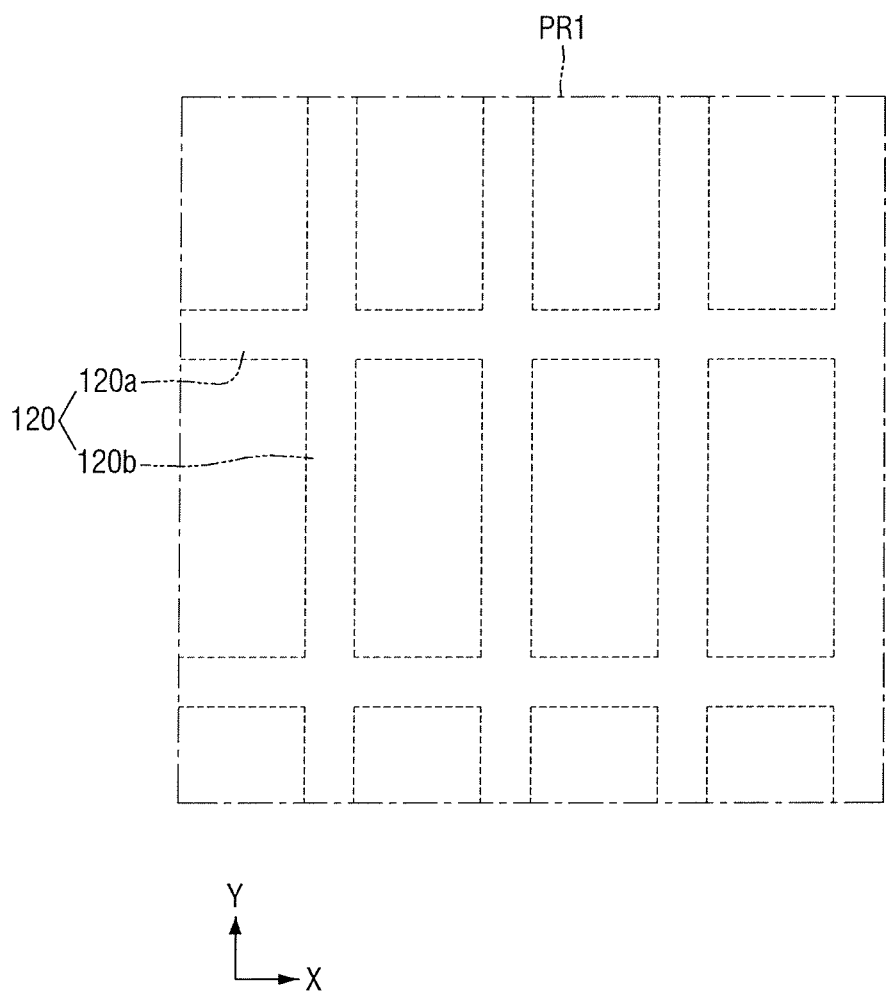
FIGS. 9A and 9B show a semiconductor device according to some example embodiments.
Figure 9B:
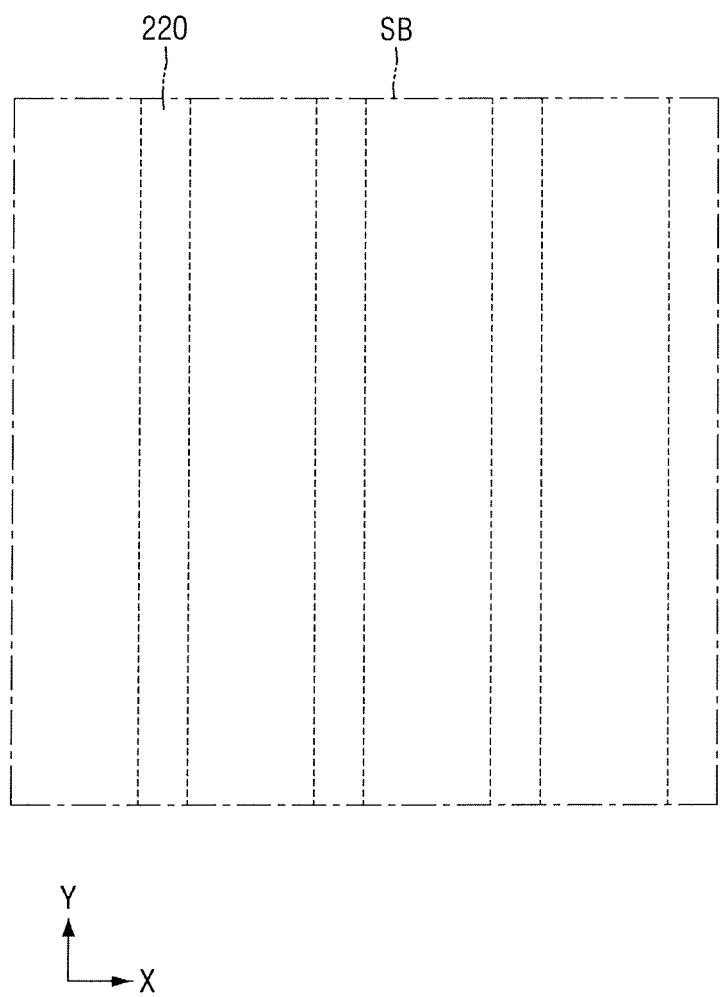

FIGS. 9A and 9B show a semiconductor device according to some example embodiments. For convenience of explanation, differences that are not described above with reference to FIGS. 1 to 5C will be mainly described below.

Referring to FIGS. 9A and 9B, in the semiconductor device according to some example embodiments, a shape of the first insulating film pattern 120 formed in the first pattern forming region PR1 and a shape of the second insulating film pattern 220 formed in the shot boundary region SB may be different from each other, when viewed from the above of the semiconductor device.

The first insulating film pattern 120 may include a first portion 120a extending in the first direction X and a second portion 120b extending in the second direction Y which are intersecting each other. For example, the first insulating film pattern 120 may be a mesh shape. The second insulating film pattern 220 may include a plurality of line patterns extending longitudinally in the second direction Y. For example, the second insulating film pattern 220 may be a line shape.

A cross sectional view take along the first direction X between the two adjacent first portions 120a of the first insulating film pattern of FIG. 9A and a cross sectional view taken along the first direction X of FIG. 9B may be similar to FIG. 4, respectively. In an exemplary embodiment, the first insulating film pattern 120 may be seen on a cross section taken along the second direction Y between the two adjacent second portions 120b of the first insulating film pattern of FIG. 9A. However, the second insulating film pattern 220 is not seen on a cross sectional view taken along the second direction Y between the two adjacent second insulating film patterns 220 of FIG. 9B.

For example, the first insulating film pattern 120 may be formed by using a combination of the pattern formed with the DSA process and the pattern formed with the photo process using the reticle.

However, only the pattern formed with the DSA process may be used to form the second insulating film pattern 220. For example, the second portion 120b of the first insulating film pattern and the second insulating film pattern 220 may be formed by using the patterns formed with the DSA process. Meanwhile, the first portion 120a of the first insulating film pattern may be formed by using the patterns formed with the photo process using the reticle.

Figure 10:
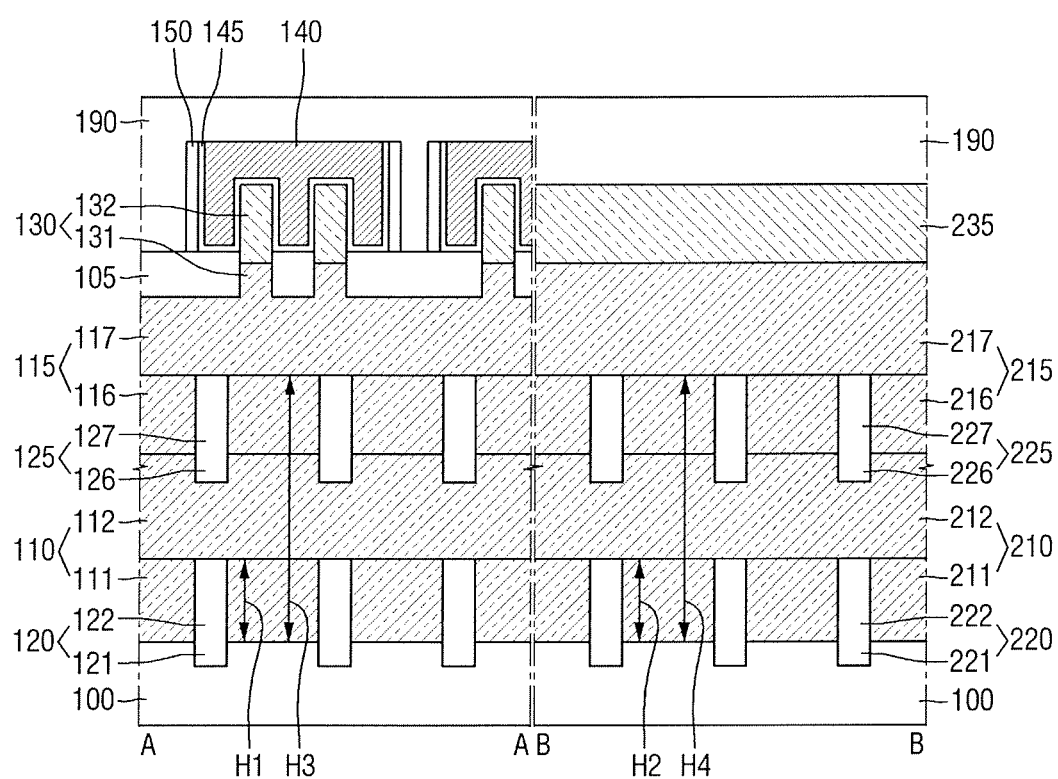
FIG. 10 shows a semiconductor device according to some example embodiments.

FIG. 10 shows a semiconductor device according to some example embodiments. For convenience of description, differences that are not described above with reference to FIGS. 1 to 5C will be mainly explained below.

Referring to FIG. 10, the semiconductor device according to some example embodiments may further include a third strain relaxed buffer layer 115, a fourth strain relaxed buffer layer 215, a third insulating film pattern 125, and a fourth insulating film pattern 225.

The third strain relaxed buffer layer 115 may be formed on the first strain relaxed buffer layer 110. The third strain relaxed buffer layer 115 may include a third lower strain relaxed buffer layer 116 and a third upper strain relaxed buffer layer 117. The fourth strain relaxed buffer layer 215 may be formed on the second strain relaxed buffer layer 210. The fourth strain relaxed buffer layer 215 may include a fourth lower strain relaxed buffer layer 216 and a fourth upper strain relaxed buffer layer 217.

The third lower strain relaxed buffer layer 116 and the fourth lower strain relaxed buffer layer 216 may be formed at a same level, and the third upper strain relaxed buffer layer 117 and the fourth upper strain relaxed buffer layer 217 may be formed at a same level.

The third lower strain relaxed buffer layer 116 and the third upper strain relaxed buffer layer 117 may be divided based on the upper surface of the third insulating film pattern 125. For example, a boundary between the third lower strain relaxed buffer layer 116 and the third upper strain relaxed buffer layer 117 may be coplanar with the upper surface of the third insulating film pattern 125.

The third strain relaxed buffer layer 115 and the fourth strain relaxed buffer layer 215 may include a compound semiconductor. In the semiconductor device according to some example embodiments, it is described that the third strain relaxed buffer layer 115 and the fourth strain relaxed buffer layer 215 are SiGe (silicon germanium) layers. The third strain relaxed buffer layer 115 and the fourth strain relaxed buffer layer 215 may include, for example, $Si_{1-w}Ge_w$. Herein, w may be greater than 0 and less than 1. A germanium fraction of the third strain relaxed buffer layer 115 may be greater than a germanium fraction of the first strain relaxed buffer layer 110, and a germanium fraction of the fourth strain relaxed buffer layer 215 may be greater than a germanium fraction of the second strain relaxed buffer layer 210.

When the first pattern forming region PR1 is the PMOS forming region, the upper portion 132 of the first fin-type pattern may include a material having a lattice constant greater than a lattice constant of the third upper strain relaxed buffer layer 117. For example, the upper portion 132 of the first fin-type pattern may include a silicon germanium pattern having a germanium fraction greater than a germanium fraction of the third upper strain relaxed buffer layer 117, or the upper portion 132 of the first fin-type pattern may be a germanium pattern.

When the first pattern forming region PR1 is the NMOS forming region, the upper portion 132 of the first fin-type pattern may include a material having a lattice constant less than a lattice constant of the third upper strain relaxed buffer layer 117.

Similarly to FIG. 5A, a germanium fraction of the third lower strain relaxed buffer layer 116 and a germanium fraction of the fourth lower strain relaxed buffer layer 216 may be consistent in the thickness direction of the substrate 100. In an exemplary embodiment, similarly to FIGS. 5B and 5C, a germanium fraction of the third lower strain relaxed buffer layer 116 and a germanium fraction of the fourth lower strain relaxed buffer layer 216 may increase as being farther away from the substrate 100.

The third insulating film pattern 125 may be formed on the first insulating film pattern 120. At least a portion of the third insulating film pattern 125 may be disposed within the third strain relaxed buffer layer 115. For example, the third insulating film pattern 125 may be formed across a portion of the first strain relaxed buffer layer 110 and a portion of the third strain relaxed buffer layer 115. The upper surface of the third insulating film pattern 125 may be covered with the third strain relaxed buffer layer 115. The third insulating film pattern 125 may be formed within the first strain relaxed buffer layer 110 and the third strain relaxed buffer layer 115.

The third insulating film pattern 125 may include an upper portion 127 and a lower portion 126. The lower portion 126 of the third insulating film pattern may be formed within the first strain relaxed buffer layer 110, and the upper portion 127 of the third insulating film pattern may be formed within the third strain relaxed buffer layer. 115.

The third insulating film pattern 125 may extend across a portion of the first upper strain relaxed buffer layer 112 and the third lower strain relaxed buffer layer 116. The third upper strain relaxed buffer layer 117 may cover the upper surface of the third insulating film pattern 125. The upper surface of the third insulating film pattern 125 may be formed within the third lower strain relaxed buffer layer 116.

The fourth insulating film pattern 225 may be formed on the second insulating film pattern 220. At least a portion of the fourth insulating film pattern 225 may be disposed within the fourth strain relaxed buffer layer 215. For example, the fourth insulating film pattern 225 may be formed across a portion of the second strain relaxed buffer layer 210 and a portion of the fourth strain relaxed buffer layer 215. The upper surface of the fourth insulating film pattern 225 may be covered with the fourth strain relaxed buffer layer 215. The fourth insulating film pattern 225 may be formed within the second strain relaxed buffer layer 210 and the fourth strain relaxed buffer layer 215.

The fourth insulating film pattern 225 may include an upper portion 227 and a lower portion 226. The lower portion 226 of the fourth insulating film pattern may be formed within the second strain relaxed buffer layer 210, and the upper portion 227 of the fourth insulating film pattern may be formed within the fourth strain relaxed buffer layer 215.

The fourth insulating film pattern 225 may extend across a portion of the second upper strain relaxed buffer layer 212 and the fourth lower strain relaxed buffer layer 216. The fourth upper strain relaxed buffer layer 217 may cover the upper surface of the fourth insulating film pattern 225. The upper portion 227 of the fourth insulating film pattern may be formed within the fourth lower strain relaxed buffer layer 216.

In the semiconductor device according to some example embodiments, a height H3 from the substrate 100 to the upper surface of the third insulating film pattern 125 may be substantially same as a height H4 from the substrate 100 to the upper surface of the fourth insulating film pattern 225.

A height from the substrate 100 to a lower surface of the third insulating film pattern 125 may be greater than a height H1 from the substrate 100 to the upper surface of the first insulating film pattern 120. Further, a height from the substrate 100 to a lower surface of the fourth insulating film pattern 225 may be greater than a height H2 from the substrate 100 to the upper surface of the second insulating film pattern 220.

In FIG. 10, the first insulating film pattern 120 and the third insulating film pattern 125 may be arrayed in the thickness direction of the substrate 100, and the second insulating film pattern 220 and the fourth insulating film pattern 225 may be arrayed in the thickness direction of the substrate 100. The present inventive concept is not be limited thereto.

When viewed from the above, the third insulating film pattern 125 and the fourth insulating film pattern 225 may include, for example, a mesh shape, a line shape, and a circular shape. Further, when viewed from the above, a shape of the third insulating film pattern 125 and a shape of the fourth insulating film pattern 225 may same as each other, or different from each other.

Figure 11:
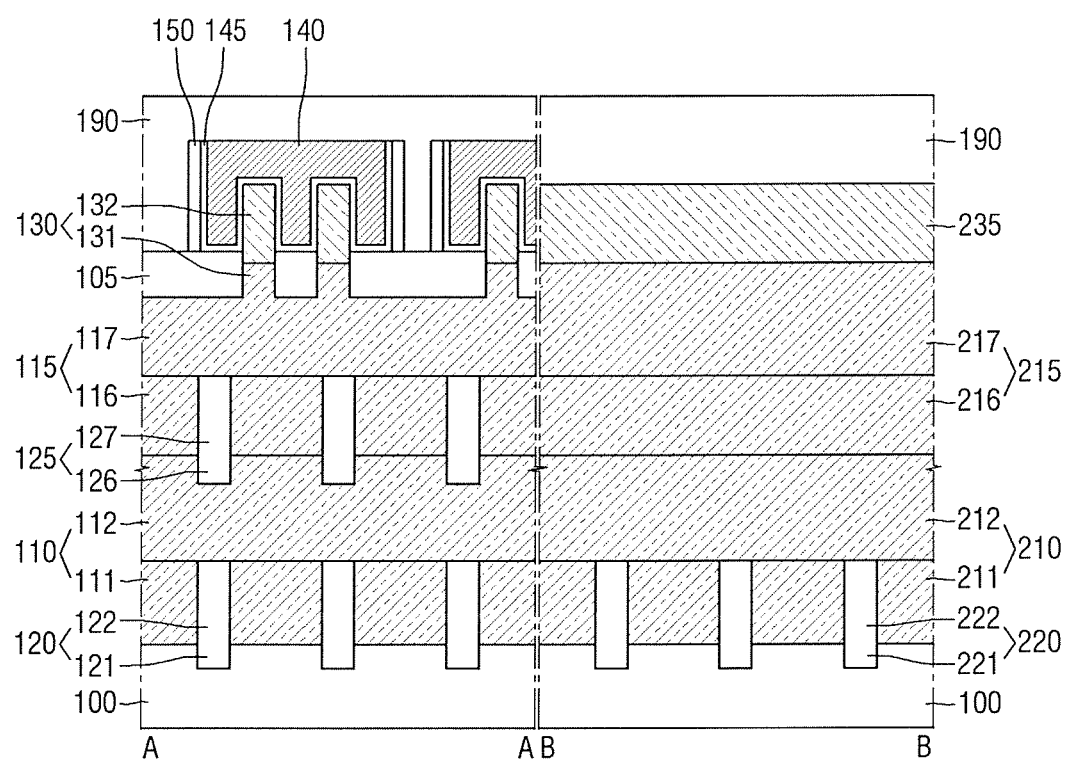
FIG. 11 shows a semiconductor device according to some example embodiments.

FIG. 11 shows a semiconductor device according to some example embodiments. For convenience of explanation, differences that are not described above with reference to FIG. 10 will be mainly explained below.

Referring to FIG. 11, in the semiconductor device according to some example embodiments, an insulating film pattern similar to the third insulating film pattern 125 may not be formed on the peripheral region PERI. An insulating film pattern extending across a portion of the second strain relaxed buffer layer 210 and a portion of the fourth strain relaxed buffer layer 215 need not be formed in the peripheral region PERI which is at a level that the third insulating film pattern 125 is formed based on the substrate 100.

For example, the third insulating film pattern 125 may be formed by using the pattern formed with the photo process using the reticle. Because the pattern to form an insulating film pattern is not formed in the peripheral region PERI, an insulating film pattern need not be formed in the peripheral region PERI at a level that the third insulating film pattern 125 is formed.

Figure 12:
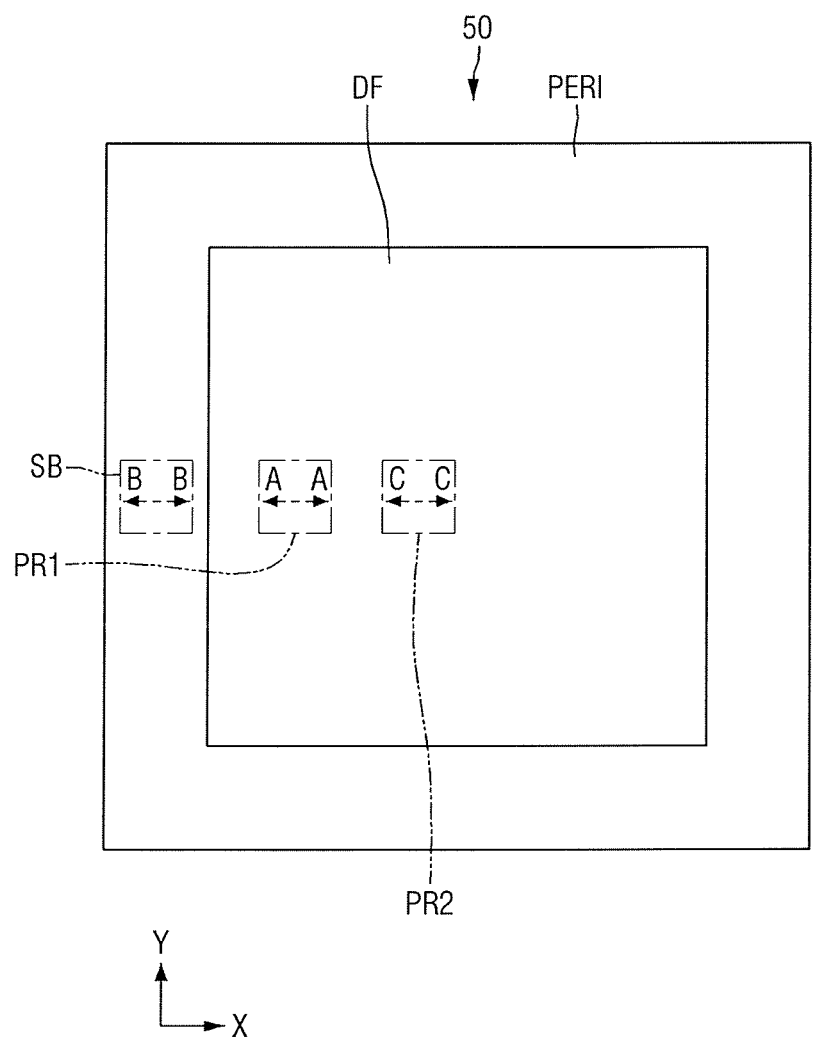
FIG. 12 shows semiconductor die regions that includes a semiconductor device according to some example embodiments.
Figure 13:
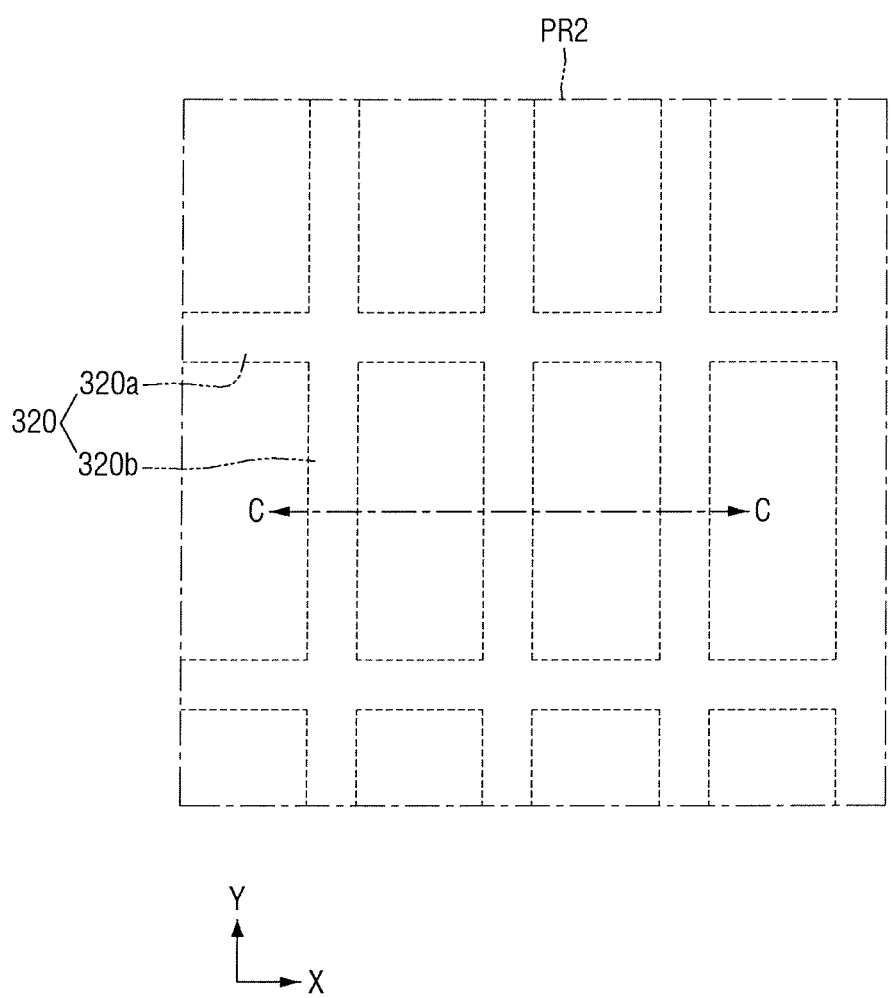
FIG. 13 is a top view of a shape of a third insulating film pattern in the second pattern forming region in FIG. 12.
Figure 14:
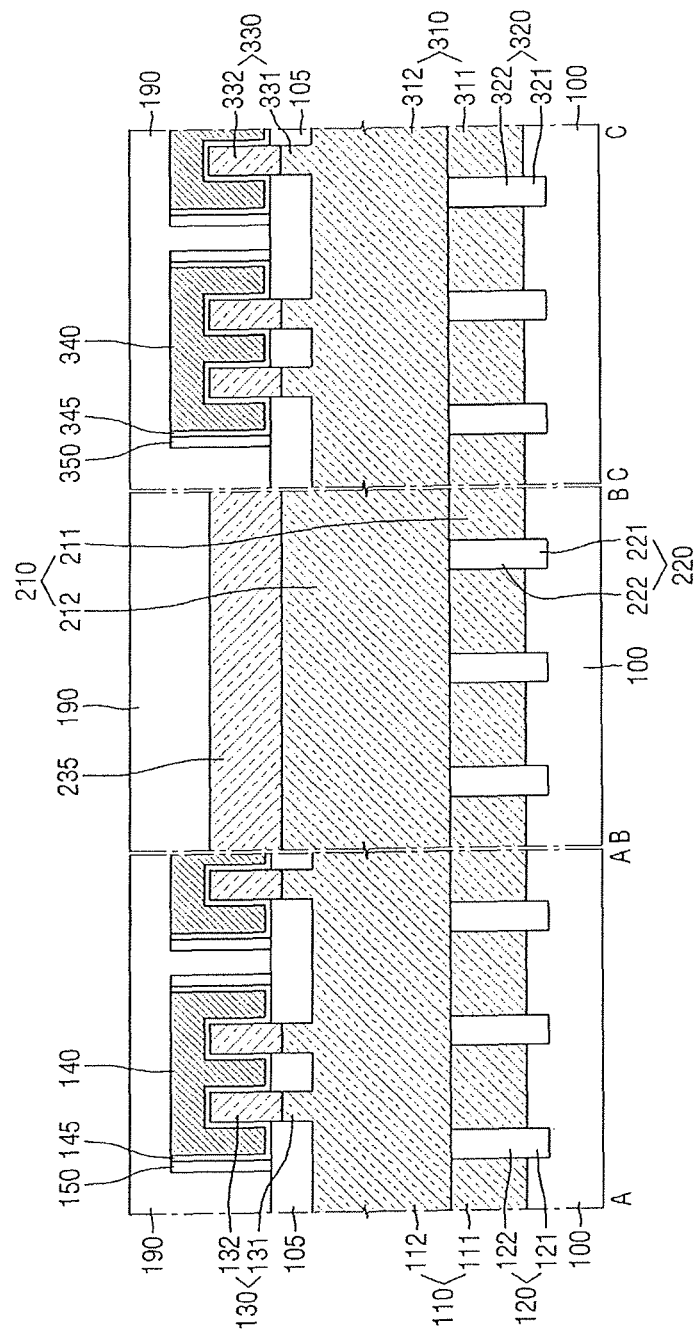
FIG. 14 is a cross sectional view taken along lines A-A, B-B and C-C of FIG. 12.

FIG. 12 shows semiconductor die regions that include a semiconductor device according to some example embodiments. FIG. 13 is a top view of a shape of a third insulating film pattern on the second pattern forming region in FIG. 12. FIG. 14 is a cross sectional view taken along lines A-A, B-B and C-C of FIG. 12. For convenience of description, differences that are not described above with reference to FIGS. 1 to 5C will be mainly described below.

For reference, a shape of the first insulating film pattern in the first pattern forming region may be substantially same as in FIG. 3A, and a shape of the second insulating film pattern in the shot boundary region may be substantially same as in FIG. 3B. Further, the illustration in FIG. 13 omits the fin-type pattern and the gate electrode. Additionally, sectional lines A-A and B-B of FIG. 12 may correspond to the sectional lines of FIGS. 3A and 3B.

Referring to FIGS. 12 to 14, the semiconductor device according to some embodiments may include the substrate 100, the first strain relaxed buffer layer 110, the second strain relaxed buffer layer 210, a fifth strain relaxed buffer layer 310, the first insulating film pattern 120, the second insulating film pattern 220, a fifth insulating film pattern 320, the first gate electrode 140, and the second gate electrode 340.

The device forming region DF may include the first pattern forming region PR1 and a second pattern forming region PR2. The first pattern forming region PR1 and the second pattern forming region PR2 may be regions spaced apart from each other or adjacent to each other.

In the semiconductor device according to some example embodiments, it is described that the first pattern forming region PR1 may be the PMOS forming region, and the second pattern forming region PR2 may be the NMOS forming region.

Since the substrate 100, the first strain relaxed buffer layer 110, the second strain relaxed buffer layer 210, the first insulating film pattern 120, the second insulating film pattern 220, and the first gate electrode 140 are described with reference to FIGS. 1 to 5C, only differences will be briefly explained below.

The fifth strain relaxed buffer layer 310 may be formed on the substrate 100. The fifth strain relaxed buffer layer 310 may be formed in the second pattern forming region PR2. The fifth strain relaxed buffer layer 310 may include a fifth lower strain relaxed buffer layer 311 and a fifth upper strain relaxed buffer layer 312. The boundary of the fifth upper strain relaxed buffer layer 312 and the fifth lower strain relaxed buffer layer 311 may be the upper surface of the fifth insulating film pattern 320.

The first lower strain relaxed buffer layer 111 and the fifth lower strain relaxed buffer layer 311 may be formed at a same level, and the first upper strain relaxed buffer layer 112 and the fifth upper strain relaxed buffer layer 312 may be formed at a same level. The fifth strain relaxed buffer layer 310 may include a compound semiconductor. For example, the fifth strain relaxed buffer layer 310 may include a SiGe (silicon germanium) layer, for example.

The fifth insulating film pattern 320 may be formed on the substrate 100. At least a portion of the fifth insulating film pattern 320 may be disposed within the fifth strain relaxed buffer layer 310. For example, the fifth insulating film pattern 320 may be formed across a portion of the substrate 100 and a portion of the fifth strain relaxed buffer layer 310. The upper surface of the fifth insulating film pattern 320 may be covered with the fifth strain relaxed buffer layer 310.

The fifth insulating film pattern 320 may include an upper portion 322 and a lower portion 321. The lower portion 321 of the fifth insulating film pattern may be formed within the substrate 100, and the upper portion 322 of the fifth insulating film pattern may be formed within the fifth strain relaxed buffer layer 310. The fifth insulating film pattern 320 may extend across a portion of the substrate 100 and the fifth lower strain relaxed buffer layer 311. The fifth upper strain relaxed buffer layer 312 may cover the upper surface of the fifth insulating film pattern 320. The upper portion 322 of the fifth insulating film pattern 320 may be formed within the fifth lower strain relaxed buffer layer 311.

Referring to FIGS. 3A and 13, a shape of the first insulating film pattern 120 and a shape of the fifth insulating film pattern 320 may be same as each other when viewed from a top view. The first insulating film pattern 120 and the fifth insulating film pattern 320 may be formed at a same level.

In FIG. 13, the fifth insulating film pattern 320 may include a first portion 320a extending in the first direction X and a second portion 320b extending in the second direction Y. The first portion 320a of the fifth insulating film pattern and the second portion 320b of the fifth insulating film pattern, which extend in different directions from each other, may intersect each other.

A second fin-type pattern 330 may be formed on the fifth strain relaxed buffer layer 310. The second fin-type pattern 330 may protrude from the fifth strain relaxed buffer layer 310.

The second fin-type pattern 330 may include a lower portion 331 and an upper portion 332. The lower portion 331 of the second fin-type pattern may be formed by etching a portion of the fifth strain relaxed buffer layer 310, or more specifically, by etching a portion of the fifth upper strain relaxed buffer layer 312. The upper portion 332 of the second fin-type pattern may include a material having a different lattice constant from that of the fifth strain relaxed buffer layer 310. For example, the upper portion 332 of the second fin-type pattern may include a material having a different lattice constant from a lattice constant of the fifth upper strain relaxed buffer layer 312.

In the semiconductor device according to some example embodiments, the upper portion 132 of the first fin-type pattern may include a material having a lattice constant greater than lattice constant of the first upper strain relaxed buffer layer 112, and the upper portion 332 of the second fin-type pattern may include a material having a lattice constant less than a lattice constant of the fifth upper strain relaxed buffer layer 312 or a III-V compound semiconductor having a high electron mobility.

For example, the upper portion 332 of the second fin-type pattern may include a different material from the upper portion 132 of the first fin-type pattern. The upper portion 132 of the first fin-type pattern may include a silicon germanium pattern having a greater germanium fraction than that of the first upper strain relaxed buffer layer 112, or a germanium pattern. The upper portion 332 of the second fin-type pattern may include a silicon pattern, or a III-V compound semiconductor pattern.

In FIG. 14, the first fin-type pattern 130 and the second fin-type pattern 330 extend longitudinally in the second direction Y. The present inventive concept is not limited thereto.

The second gate electrode 340 may be formed on the second fin-type pattern 330 so as to intersect the second fin-type pattern 330. A second gate insulating film 345 may be formed between the second gate electrode 340 and the second fin-type pattern 330. A second gate spacer 250 may be formed on a sidewall of the second gate electrode 240.

FIGS. 15 to 22 show a method of fabricating a semiconductor device according to some example embodiments.

Figure 15:
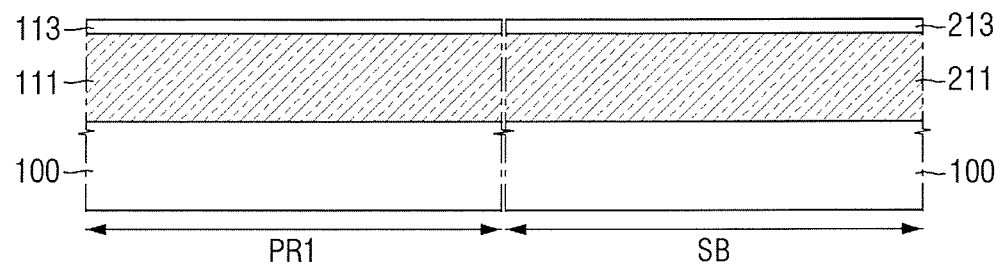
FIGS. 15 to 22 show a method for fabricating a semiconductor device according to some example embodiments.

Referring to FIG. 15, the first lower strain relaxed buffer layer 111 and the second lower strain relaxed buffer layer 211 may be formed on the substrate 100 including the first pattern forming region PR1 and the shot boundary region SB.

The first lower strain relaxed buffer layer 111 may be formed in the first pattern forming region PR1, and the second lower strain relaxed buffer layer 211 may be formed in the shot boundary region SB. Using an epitaxial growth method, the first lower strain relaxed buffer layer 111 and the second lower strain relaxed buffer layer 211 may be simultaneously formed.

With an epitaxial growth method, a first insertion semiconductor film 113 and a second insertion semiconductor film 213 may be each formed on the first lower strain relaxed buffer layer 111 and the second lower strain relaxed buffer layer 211. The first insertion semiconductor film 113 and the second insertion semiconductor film 213 may include different materials from the first lower strain relaxed buffer layer 111 and the second lower strain relaxed buffer layer 211. For example, the first insertion semiconductor film 113 and the second insertion semiconductor film 213 may include silicon layers, but the present inventive concept is not limited thereto.

In an exemplary embodiment, the first insertion semiconductor film 113 and the second insertion semiconductor film 213 need not be formed.

Figure 16:
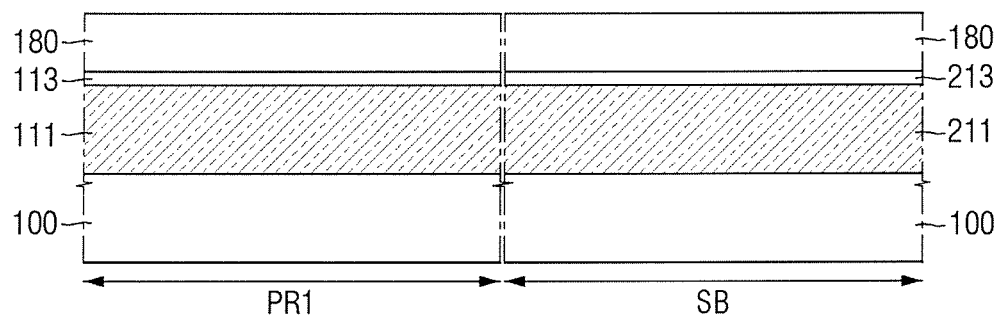

Referring to FIG. 16, a block copolymer film 180 may be formed on the first lower strain relaxed buffer layer 111 and the second lower strain relaxed buffer layer 211. For example, the block copolymer film 180 may be formed entirely on the wafer (20 of FIG. 1). For example, the block copolymer film 180 may be formed on an entire upper surface of the wafer 20 as shown in FIG. 1.

The block copolymer included in the block copolymer film 180 may include a hydrophile polymer and a hydrophobic polymer which are combined in a block form. For example, the block copolymer may include (PS-b-PMMA), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, poly- ethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxid, polyethyleneoxide-block-polymethylmethacrylate-block-polyethyleneoxide, polyethyleneoxide-block-polydimethylsiloxane-block-polyethyleneoxide, or polystyrene-block-polyethyleneoxide-block-polystyrene. The block copolymer film 180 may be formed with a spin-coating method, for example, after the block copolymer is dissolved in a solvent. The solvent may be, for example, toluene. After the coating, the solvent may evaporate from the block copolymer film 180.

Figure 17:
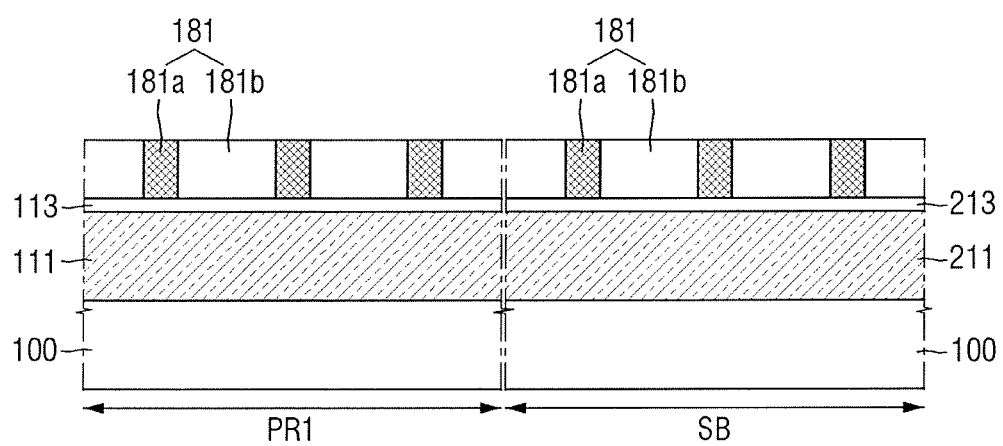

Referring to FIG. 17, the block copolymer film 180 may be processed with an annealing process. The annealing process may, for example, irradiate the ultraviolet rays UV or apply heats to the block copolymer film 180. The annealing process may be performed at or above a glass transition temperature Tg of the block copolymer.

Due to the annealing process, the micro-phase separation phenomenon may occur within the block copolymer film 180. A pattern film 181 including a first pattern 181a and a second pattern 181b may be formed on the first lower strain relaxed buffer layer 111 and the second lower strain relaxed buffer layer 211. For example, the first pattern 181a may be formed at a position corresponding to the first insulating film pattern 120 and the second insulating film pattern 220 of FIGS. 3A and 3B. Accordingly, the second pattern 181b may be spaced apart from each other, and the first pattern 181a may fill a gap between two adjacent second patterns 181b. Further, the first pattern 181a and the second pattern 181b may have different properties from each other.

A phase separation process of the block copolymer will be described below by referring to FIGS. 18A and 18B.

The DSA process may use the phase separation process of the block copolymer. The DSA process refers to a method of self-forming a pattern. The DSA process is a chemical pattern forming method, and it is the method of applying the block copolymer to form a micro-pattern. The block copolymer may include two polymer having different properties from each other which are compounded into one molecule.

The DSA process is based on the molecules' self-assembly phenomenon. The demand for DSA process increases because the semiconductor micro-processing is meeting the limits and despite EUV mass-production, the difficulty level of the micro-processes has gradually increased.

Figure 18A:
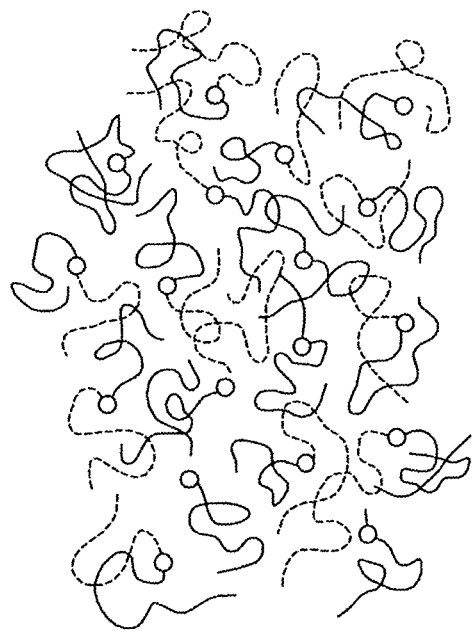
Figure 18B:
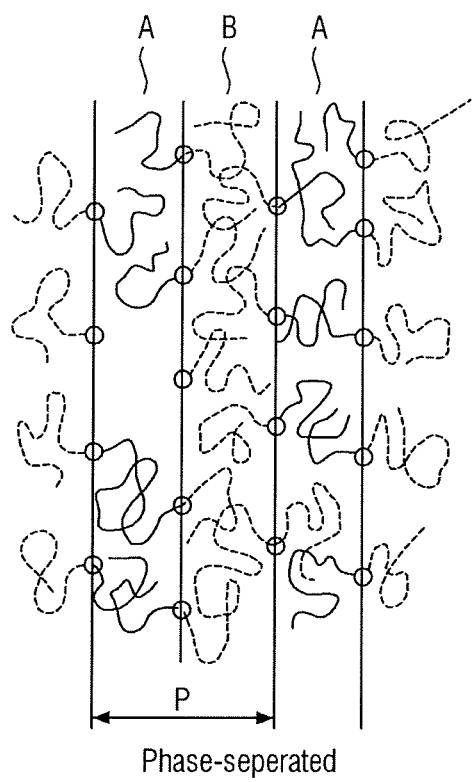

Referring to FIGS. 18A and 18B, regarding the block copolymer, block junctions are formed with the covalent bonding of one ends of a first polymer block A and a second polymer block B. The other ends, which are not connected by the block junction, may repel one another. For example, one of the first polymer block A and the second polymer block B may exhibit the hydrophilic property and the other may exhibit the hydrophobic property. The hydrophilic polymer block may have a polarity.

When the annealing process is performed in a homogeneous state in which the first polymer block A and the second polymer block B are disorderedly positioned, the first polymer block A and the second polymer block B may become the microphase separation state in which the first polymer block A and the second polymer block B are self-assembled and separated into different domains from each other. A pitch P between the first polymer block A domains may be consistent in the microphase separation state. That is, a width of the first polymer block A domain and a width of the second polymer block B domain may be consistent respectively. Each width of the polymer block A, B domains may be determined by each molecular weight of the polymer blocks A, B.

Figure 19:
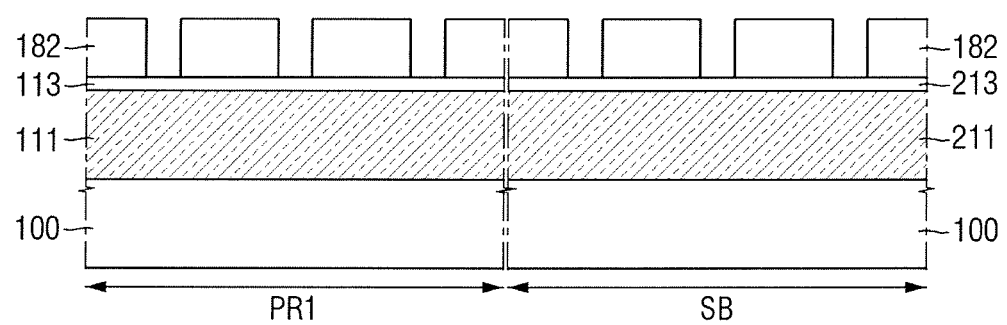

Referring to FIG. 19, a mask pattern 182 may be formed on the first lower strain relaxed buffer layer 111 and the second lower strain relaxed buffer layer 211 by removing one of the first pattern 181a and the second pattern 181b. For example, the mask pattern 182 including the second pattern 181b may be formed by removing the first pattern 181a. For example, the mask pattern 182 may correspond to the second pattern 181b which remains after the removing of the first pattern 181a.

Figure 20:
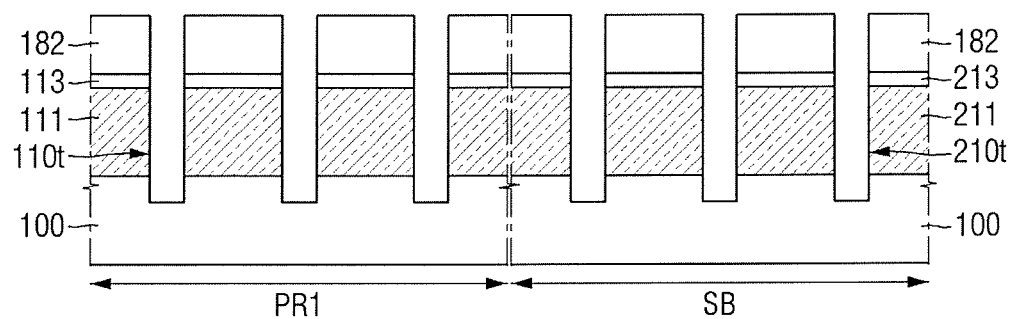

Referring to FIG. 20, a first trench 110t and a second trench 210t may be formed by removing the first lower strain relaxed buffer layer 111 and the second lower strain relaxed buffer layer 211 with the mask pattern 182. The first trench 110t may be formed in the first pattern forming region PR1, and the second trench 210t may be formed in the shot boundary region SB.

The first trench 110t and the second trench 210t may expose the substrate 100. For example, a portion of the sidewall of the first trench 110t and a portion of the sidewall of the second trench 210t may be defined by the substrate 100. The first lower strain relaxed buffer layer 111 and the second lower strain relaxed buffer layer 211 may have elastic stress relaxation, as the first trench 110t and the second trench 210t are formed.

In an exemplary embodiment, the mask pattern 182 may serve as an etching mask while the first trench 110t and the second trench 110t and the second trench 210t are formed.

Next, the mask pattern 182 may be removed.

Figure 21:
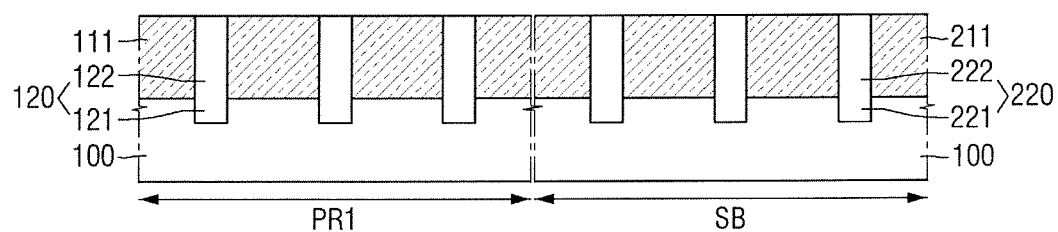

Referring to FIG. 21, the first insulating film pattern 120 filling the first trench 110t, and the second insulating film pattern 220 filling the second trench 210t may be formed.

An insulating film covering the first insertion semiconductor film 113 and the second insertion semiconductor film 213 may be formed while the first trench 110t and the second trench 210t are being filled. Next, the insulating film may be planarized until the first lower strain relaxed buffer layer 111 and the second lower strain relaxed buffer layer 211 are exposed.

Figure 22:
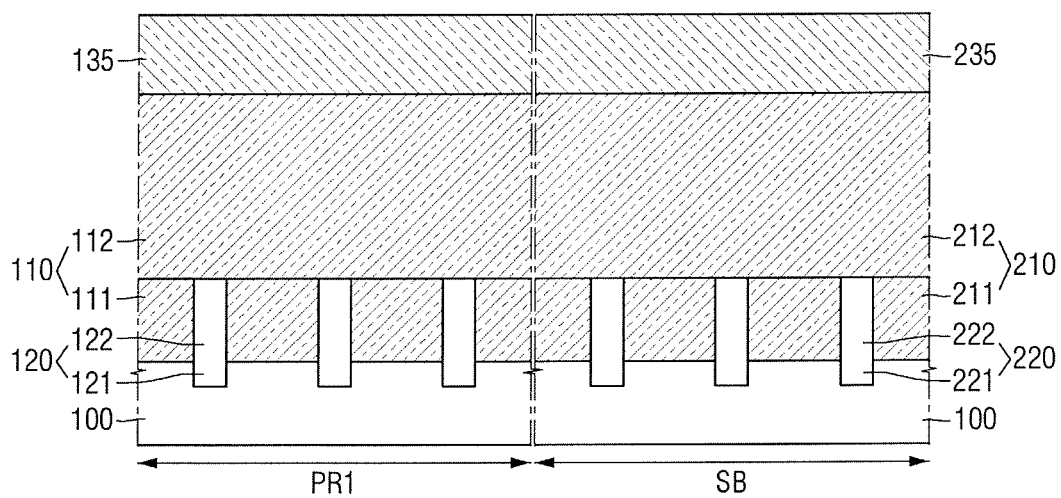

Referring to FIG. 22, the first upper strain relaxed buffer layer 112 and the second upper strain relaxed buffer layer 212 may be formed on the first insulating film pattern 120 and the second insulating film pattern 220. The first upper strain relaxed buffer layer 112 and the second upper strain relaxed buffer layer 212 may be formed with the epitaxial growth method.

A pre-channel film 135 may be formed on the first upper strain relaxed buffer layer 112, and the dummy channel layer 235 may be formed on the second upper strain relaxed buffer layer 212.

Referring back to FIG. 4, the first fin-type pattern 130 and the first gate electrode 140 intersecting the first fin-type pattern 130 may be formed.

The first strain relaxed buffer layer 110, the first lower strain relaxed buffer layer 111 and the first upper strain relaxed buffer layer 112 may be referred to as a first compound semiconductor layer 110, the first lower compound semiconductor layer 111 and the first upper compound semiconductor layer 112. The first strain relaxed buffer layer 110, the first lower strain relaxed buffer layer 111 and the first upper strain relaxed buffer layer 112 may be also referred to as a first SiGe (silicon germanium) layer 110, the first lower SiGe layer 111 and the first upper SiGe layer 112.

The second strain relaxed buffer layer 210, the second lower strain relaxed buffer layer 211 and the second upper strain relaxed buffer layer 212 may be referred to as a second compound semiconductor layer 210, the second lower compound semiconductor layer 211 and the second upper compound semiconductor layer 212. The second strain relaxed buffer layer 210, the second lower strain relaxed buffer layer 211 and the second upper strain relaxed buffer layer 212 may be also referred to as a second SiGe layer 210, the second lower SiGe layer 211 and the second upper SiGe layer 212.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a substrate including a pattern forming region and a peripheral region;
   a first strain relaxed buffer layer on the pattern forming region of the substrate;
   a second strain relaxed buffer layer on the peripheral region of the substrate;
   a first insulating film pattern on the substrate, an upper portion of the first insulating film pattern being disposed within the first strain relaxed buffer layer, and an upper surface of the first insulating film pattern being covered with the first strain relaxed buffer layer, and a lower portion of the first insulating film patter being disposed within the substrate;
   a second insulating film pattern on the substrate, at least a portion of the second insulating film pattern being disposed within the second strain relaxed buffer layer, and an upper surface of the second insulating film pattern being covered with the second strain relaxed buffer layer; and
   a gate electrode on the first strain relaxed buffer layer.

2. The semiconductor device of claim 1,
   wherein the first insulating film pattern extends across a portion of the substrate and a portion of the first strain relaxed buffer layer, and
   the second insulating film pattern extends across a portion of the substrate and a portion of the second strain relaxed buffer layer.

3. The semiconductor device of claim 1,
   wherein a height from an upper surface of the substrate to the upper surface of the first insulating film pattern is substantially same as a height from the upper surface of the substrate to the upper surface of the second insulating film pattern.

4. The semiconductor device of claim 1,
   wherein the first insulating film pattern includes a first lower portion, and a first upper portion on the first lower portion,
   wherein a height from the upper surface of the substrate to an upper surface of the first upper portion is substantially same as a height from the upper surface of the substrate to the upper surface of the second insulating film pattern, and
   wherein a height from the upper surface of the substrate to the upper surface of the first insulating film pattern is greater than the height from the upper surface of the substrate to a lower surface of the first lower portion.

5. The semiconductor device of claim 4,
wherein the second insulating film pattern includes a second lower portion, and a second upper portion on the second lower portion, and
wherein a height from the upper surface of the substrate to an upper surface of the second upper portion is greater than a height from the upper surface of the substrate to a lower surface of the second lower portion.

6. The semiconductor device of claim 4,
wherein the first insulating film pattern extends across a portion of the substrate and a portion of the first strain relaxed buffer layer, and
wherein the first upper portion of the first insulating film pattern is disposed within the first strain relaxed buffer layer.

7. The semiconductor device of claim 1,
wherein the substrate is a silicon substrate, and
wherein the first strain relaxed buffer layer and the second strain relaxed buffer layer have silicon and germanium.

8. The semiconductor device of claim 1,
wherein the peripheral region includes a shot boundary region of a lithography process.

9. The semiconductor device of claim 1,
wherein the gate electrode is not on the peripheral region.

10. The semiconductor device of claim 1,
wherein the first stain relaxed buffer layer includes an upper strain relaxed buffer layer and a lower strain relaxed buffer layer, and
the upper strain relaxed buffer layer is disposed on the upper portion of the first insulating film pattern.

11. A semiconductor device, comprising:
a substrate including a first pattern forming region and a peripheral region;
a first compound semiconductor layer including a first lower compound semiconductor layer and a first upper compound semiconductor layer on the first pattern forming region of the substrate;
a second compound semiconductor layer including a second lower compound semiconductor layer and a second upper compound semiconductor layer on the peripheral region of the substrate;
a first insulating film pattern extending across a portion of the substrate and the first lower compound semiconductor layer, an upper surface of the first insulating film pattern being covered with the first upper compound semiconductor layer;
a second insulating film pattern extending across a portion of the substrate and the second lower compound semiconductor layer, an upper surface of the second insulating film pattern being covered with the second upper compound semiconductor layer;
a first fin-type pattern on the first compound semiconductor layer; and
a first gate electrode intersecting the first fin-type pattern.

12. The semiconductor device of claim 11,
wherein a shape of the first insulating film pattern and a shape of the second insulating film pattern are substantially same.

13. The semiconductor device of claim 12,
wherein the first insulating film pattern and the second insulating film pattern include a mesh shape, a line shape, and a circular shape.

14. The semiconductor device of claim 11,
wherein the first insulating film pattern includes a first portion extending in a first direction and a second portion extending in a second direction which is different from the first direction so that the first insulating film pattern has a mesh shape, and
wherein the second insulating film pattern extends in the first direction so that the second insulating film pattern has a line shape.

15. The semiconductor device of claim 11, further comprising:
a third compound semiconductor layer on the first compound semiconductor layer;
a fourth compound semiconductor layer on the second compound semiconductor layer; and
a third insulating film pattern extending across a portion of the first upper compound semiconductor layer and a portion of the third compound semiconductor layer.

16. The semiconductor device of claim 15, further comprising:
a fourth insulating film pattern extending across a portion of the second upper compound semiconductor layer and a portion of the fourth compound semiconductor layer.

17. The semiconductor device of claim 11,
wherein the substrate further includes:
a second pattern forming region, and
wherein the semiconductor device further comprises:
a third compound semiconductor layer including a third lower compound semiconductor layer and a third upper compound semiconductor layer on the substrate in the second pattern forming region;
a third insulating film pattern extending across a portion of the first upper compound semiconductor layer and the third lower compound semiconductor layer, an upper surface of the third insulating film pattern being covered with the third upper compound semiconductor layer; and
a second fin-type pattern on the third compound semiconductor layer,
wherein the second fin-type pattern includes a material different from a material of the first fin-type pattern.

18. A semiconductor device, comprising:
a substrate including a pattern forming region and a peripheral region;
a first SiGe (silicon germanium) layer on the pattern forming region of the substrate;
a second SiGe (silicon germanium) layer on the peripheral region of the substrate, a germanium fraction of the second SiGe layer being substantially the same as a germanium fraction of the first SiGe layer;
a first insulating film pattern extending across a portion of the substrate and a portion of the first SiGe layer, wherein the first insulating film pattern comprises an upper portion disposed between an upper surface of the first SiGe layer and a lower surface of the first SiGe layer and a lower portion disposed between an upper surface of the substrate and a lower surface of the substrate;
a second insulating film pattern extending across a portion of the substrate and a portion of the second SiGe layer;
a fin-type pattern on the first SiGe layer, the fin-type pattern including a material having a lattice constant different from a lattice constant of the first SiGe layer; and
a gate electrode intersecting the fin-type pattern.

19. The semiconductor device of claim 18,
wherein the pattern forming region is a PMOS forming region, and wherein the fin-type pattern includes a SiGe (silicon germanium) layer having a germanium fraction greater than a germanium fraction of the first SiGe layer.

20. The semiconductor device of claim 18,
wherein the pattern forming region is an NMOS forming region, and
wherein the fin-type pattern includes a silicon pattern.

21. The semiconductor device of claim 18,
wherein the germanium fraction of the first SiGe layer is consistent in a thickness direction of the substrate,
wherein the germanium fraction of the second SiGe layer is consistent in the thickness direction of the substrate, and
wherein the thickness direction of the substrate is substantially perpendicular to an upper surface of the substrate.

\* \* \* \* \*